(12) United States Patent
Kim et al.

(10) Patent No.: US 12,218,288 B2
(45) Date of Patent: Feb. 4, 2025

(54) DISPLAY DEVICE INCLUDING INORGANIC LAYERS WITH DIFFERENT POROSITY AND METHOD OF MANUFACTURING DISPLAY DEVICE

(71) Applicant: Samsung Display Co., LTD., Yongin-si (KR)

(72) Inventors: Young Gu Kim, Yongin-si (KR); Yun Hee Park, Yongin-si (KR); Ji Yun Park, Yongin-si (KR); Suk Kung Chei, Yongin-si (KR); Kyung Seon Tak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 382 days.

(21) Appl. No.: 17/723,777

(22) Filed: Apr. 19, 2022

(65) Prior Publication Data

US 2023/0100380 A1     Mar. 30, 2023

(30) Foreign Application Priority Data

Sep. 24, 2021    (KR) ........................ 10-2021-0126560

(51) Int. Cl.
     *H01L 33/50*          (2010.01)
     *H01L 33/00*          (2010.01)

(52) U.S. Cl.
     CPC .......... *H01L 33/502* (2013.01); *H01L 33/005* (2013.01); *H01L 2933/0041* (2013.01)

(58) Field of Classification Search
     CPC ................ H01L 33/502; H01L 33/005; H01L 2933/0041; H01L 25/0753; H01L 25/167; H01L 27/156; H01L 33/50
     See application file for complete search history.

(56) References Cited

U.S. PATENT DOCUMENTS

| | | | |
|---|---|---|---|
| 10,678,091 B2 | 6/2020 | Lee et al. | |
| 10,824,012 B2 | 11/2020 | Jung et al. | |
| 10,916,722 B2 | 2/2021 | Park et al. | |
| 11,126,029 B2 | 9/2021 | Jung et al. | |
| 11,895,868 B2 * | 2/2024 | Song | H10K 59/879 |
| 2022/0052300 A1 * | 2/2022 | Seong | H10K 59/8791 |

FOREIGN PATENT DOCUMENTS

| | | |
|---|---|---|
| KR | 10-2019-0047592 | 5/2019 |
| KR | 10-2019-0088587 | 7/2019 |
| KR | 10-2020-0027109 | 3/2020 |
| KR | 10-2020-0032294 | 3/2020 |

* cited by examiner

*Primary Examiner* — Thanh Y. Tran
(74) *Attorney, Agent, or Firm* — KILE PARK REED & HOUTTEMAN PLLC

(57) ABSTRACT

A display device includes a light emitting element disposed on a substrate. A color conversion layer is disposed on the light emitting element, the color conversion layer including color conversion particles that convert light of a first color emitted from the light emitting element into light of a second color. An insulating layer is disposed on the color conversion layer. The insulating layer includes a first inorganic layer overlapping the color conversion layer, a second inorganic layer disposed on the first inorganic layer, and a third inorganic layer disposed on the second inorganic layer. A second porosity of the second inorganic layer is greater than a first porosity of the first inorganic layer. A second porosity of the second inorganic layer is greater than a third porosity of the third inorganic layer.

20 Claims, 12 Drawing Sheets

FIG. 7
<CASE1>
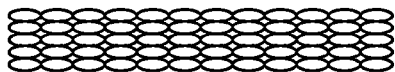
n=1.45
<CASE2>
n=1.30
<CASE3>
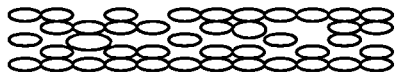
n=1.20
<CASE4>
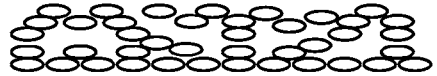
n=1.15
FIG. 8
| refractive index | EQE (%) |
|---|---|
| ref (n=1.60) | 100% |
| 1.30 | 110.2% |
| 1.27 | 113.3% |
| 1.25 | 115.0% |
| 1.23 | 116.6% |
| 1.20 | 120.7% |
| 1.17 | 121.8% |
| 1.14 | 123.6% |
| 1.00 (Air) | 125.9% |

FIG. 9

| thickness (μm) | | EQE (%) |
|---|---|---|
| ref (n=1.60) | | 100% |
| n=1.23 | 0.1 | 99.9% |
| | 0.2 | 112.0% |
| | 0.25 | 117.2% |
| | 0.3 | 119.5% |
| | 0.5 | 119.8% |
| | 0.7 | 120.5% |
| | 1.0 | 120.2% |
| | 1.5 | 120.3% |
| | 2.0 | 120.1% |
| | 2.5 | 120.6% |
| | 3.0 | 120.6% |
| | 3.5 | 120.3% |
| | 4.0 | 120.0% |

DISPLAY DEVICE INCLUDING INORGANIC LAYERS WITH DIFFERENT POROSITY AND METHOD OF MANUFACTURING DISPLAY DEVICE

CROSS-REFERENCE TO RELATED APPLICATION(S)

This application claims priority to and benefits of Korean Patent Application No. 10-2021-0126560 under 35 U.S.C. § 119, filed on Sep. 24, 2021, in the Korean Intellectual Property Office (KIPO), the entire contents of which are herein incorporated by reference.

BACKGROUND

1. Technical Field

The disclosure relates to a display device and a method of manufacturing the display device.

2. Description of the Related Art

In recent years, as interest in information display is increasing, research and development for a display device is continuously being conducted.

SUMMARY

An aspect of the disclosure is to provide a display device capable of improving light output efficiency, and a method of manufacturing the display device.

According to an embodiment, a display device may include a light emitting element disposed on a substrate, a color conversion layer disposed on the light emitting element, the color conversion layer including color conversion particles that convert light of a first color emitted from the light emitting element into light of a second color, and an insulating layer disposed on the color conversion layer. The insulating layer may include a first inorganic layer overlapping the color conversion layer, a second inorganic layer disposed on the first inorganic layer, and a third inorganic layer disposed on the second inorganic layer. A second porosity of the second inorganic layer may be greater than a first porosity of the first inorganic layer, and a second porosity of the second inorganic layer may be greater than a third porosity of the third inorganic layer.

According to an embodiment, the second porosity of the second inorganic layer may be within a range of about 20% to about 80%.

According to an embodiment, the first porosity of the first inorganic layer may be less than the third porosity of the third inorganic layer.

According to an embodiment, the first porosity of the first inorganic layer may be less than or equal to about 5%, and the third porosity of the third inorganic layer may be less than or equal to about 20%.

According to an embodiment, a second refractive index of the second inorganic layer may be less than a first refractive index of the first inorganic layer.

According to an embodiment, the second refractive index of the second inorganic layer may be within a range of about 1.1 to about 1.3.

According to an embodiment, the second refractive index of the second inorganic layer may be about 1.2.

According to an embodiment, a thickness of the second inorganic layer may be within a range of about 0.3 μm to about 0.6 μm.

According to an embodiment, a thickness of the first inorganic layer may be greater than or equal to about 0.1 μm, and a thickness of the third inorganic layer may be greater than or equal to about 0.1 μm.

According to an embodiment, the first inorganic layer, the second inorganic layer, and the third inorganic layer may include a same material.

According to an embodiment, at least part of the first inorganic layer, the second inorganic layer, and the third inorganic layer may include different materials.

According to an embodiment, the second inorganic layer may include hydrogenated amorphous silicon (a-Si:H).

According to an embodiment, the second inorganic layer may further include at least one of silicon oxide (SiOx), silicon nitride (SiNx), and silicon oxynitride (SiON).

According to an embodiment, the insulating layer may not include hollow silica and an organic material.

According to an embodiment, the first inorganic layer, the second inorganic layer, and the third inorganic layer may be formed through chemical vapor deposition, and a deposition condition of the second inorganic layer may be different from a deposition condition of the first inorganic layer.

According to an embodiment, the display device may further include a color filter disposed on the insulating layer, and an overcoat layer disposed on the color filter.

According to an embodiment, the light emitting element may include an inorganic light emitting diode.

According to an embodiment, a method of manufacturing a display device may include forming a color conversion layer on a display element layer that includes a light emitting element, and forming an insulating layer on the color conversion layer through chemical vapor deposition. The forming of the insulating layer may include forming a first inorganic layer on the color conversion layer under a first deposition condition, forming a second inorganic layer on the first inorganic layer under a second deposition condition, and forming a third inorganic layer on the second inorganic layer. The first deposition condition may be different from the second deposition condition, and a second porosity of the second inorganic layer may be greater than a first porosity of the first inorganic layer.

According to an embodiment, the first porosity of the first inorganic layer may be less than the third porosity of the third inorganic layer.

According to an embodiment, a second refractive index of the second inorganic layer may be less than a first refractive index of the first inorganic layer.

A display device according to an embodiment may include an insulating layer disposed on a color conversion layer, and the insulating layer may include a first inorganic layer, a second inorganic layer, and a third inorganic layer having different porosities and/or refractive indices. Since the first to third inorganic layers may include a same material (for example, inorganic material), coupling force between the first to third inorganic layers may be improved. Since an expensive inorganic filler (for example, hollow silica) used to form a conventional organic insulating layer may not be used to form the insulating layer, a manufacturing cost of the display device may be reduced.

A method of manufacturing the display device according to an embodiment may form an insulating layer including first to third inorganic layers having different porosities and/or refractive indices using one deposition technique (for example, chemical vapor deposition). Therefore, compared to a method of manufacturing a display device using various deposition techniques (for example, physical deposition and an inkjet method), a manufacturing process of the display device may be simplified.

Effects according to an embodiment of the disclosure are not limited by the contents exemplified above, and additional various effects are included in the disclosure.

BRIEF DESCRIPTION OF THE DRAWINGS

The above and other features of the disclosure will become more apparent by describing in further detail embodiments thereof with reference to the accompanying drawings, in which:

FIG. 7 is a schematic diagram illustrating a density and a refractive index of a second inorganic layer included in the insulating layer of FIG. 6;

FIG. 8 is a schematic diagram illustrating external quantum efficiency according to the refractive index of the second inorganic layer included in the insulating layer of FIG. 6;

FIG. 9 is a schematic diagram illustrating external quantum efficiency according to a thickness of the second inorganic layer included in the insulating layer of FIG. 6;

DETAILED DESCRIPTION OF THE EMBODIMENTS

Figure 1:
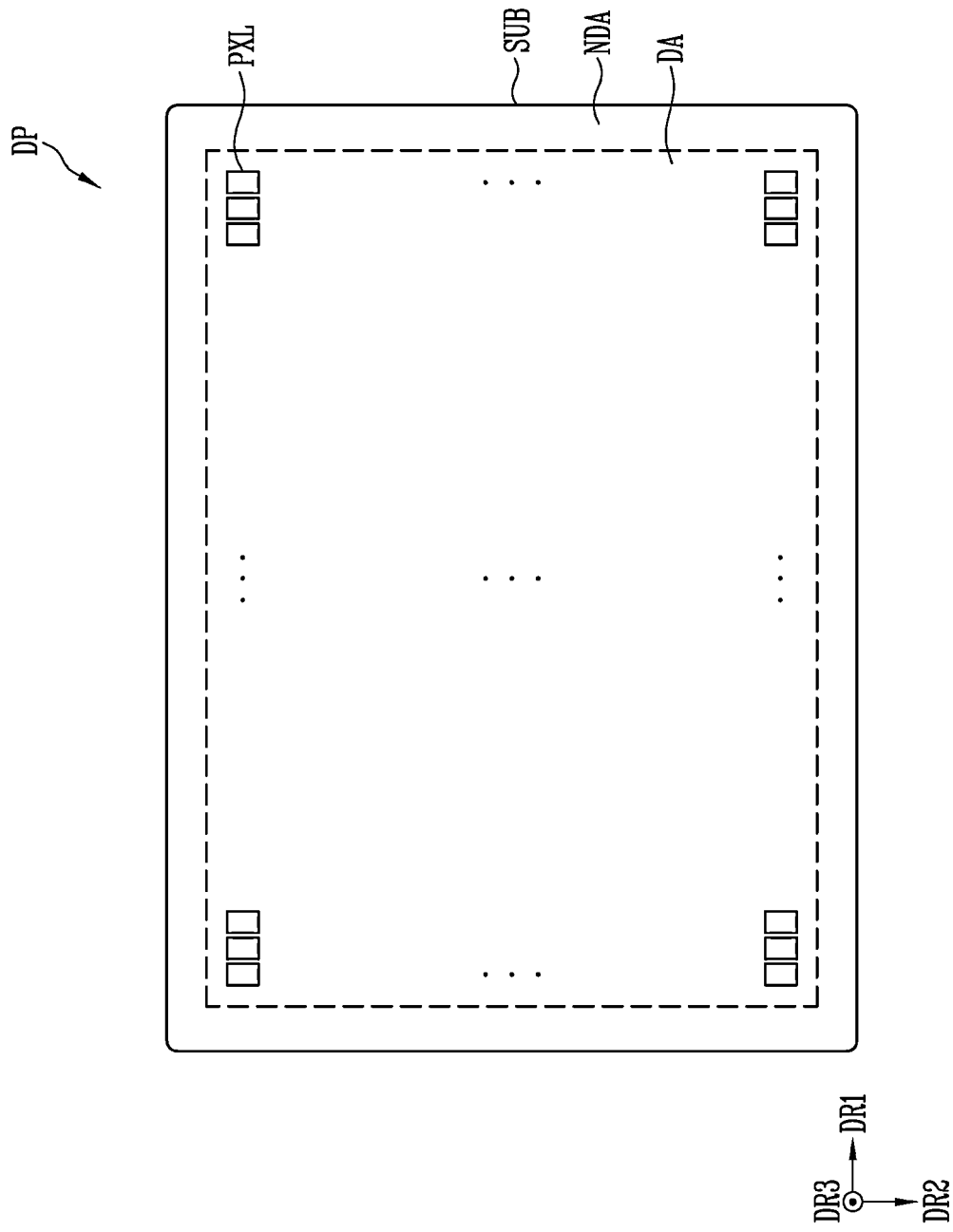
FIG. 1 is a schematic plan view schematically illustrating a display device according to embodiments of the disclosure.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and scope of the disclosure.

Similar reference numerals are used for similar components in describing each drawing. In the accompanying drawings, the dimensions of the structures may be shown differing (e.g., enlarged) from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. In the following description, the singular expressions include plural expressions unless the context clearly dictates otherwise.

It should be understood that in the application, terms such as "include", "have", and "comprise" are used to specify that there is a feature, a number, a step, an operation, a component, a part, or a combination thereof described in the specification, but do not exclude a possibility of the presence or addition of one or more other features, numbers, steps, operations, components, parts, or combinations thereof. A case where a portion of a layer, a layer, an area, a plate, or the like is referred to as being "on" another portion, it includes not only a case where the portion is "directly on" another portion, but also a case where there is further another portion between the portion and another portion. In the application, when a portion of a layer, a layer, an area, a plate, or the like is formed on another portion, a forming direction is not limited to an upper direction but includes forming the portion on a side surface or in a lower direction. In case that a portion of a layer, a layer, an area, a plate, or the like is formed "under" another portion, this includes not only a case where the portion is "directly beneath" another portion but also a case where there is further another portion between the portion and another portion.

In the application, in a case where a component (for example, "a first component") is operatively or communicatively "coupled" with/to or "connected to" another component (for example, "a second component"), the case should be understood that the component may be directly connected to the other component, or may be connected to the other component through another component (for example, a "third component"). In contrast, in a case where a component (for example, "a first component") is "directly coupled" with/to or "directly connected" to another component (for example, "a second component"), the case may be understood that another component (for example, "a third component") is not present between the component and the other component.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view schematically illustrating a display device according to embodiments of the disclosure. For convenience, in FIG. 1, a structure of the display panel DP is briefly shown based on a display area DA. However, according to an embodiment, at least one driving circuit unit, lines, and/or pads, which is/are not shown may be further provided on a display panel DP.

Referring to FIG. 1, the display device may include the display panel DP. In case that the display device is a display device in which a display surface is applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, an automotive (or a vehicle display), a transparent display, or a wearable (for example, glass glasses, and a smart watch), the disclosure may be applied to the display device.

The display panel DP may have various shapes. For example, the display panel DP may be provided in a rectangular plate shape, but is not limited thereto. For example, the display panel DP may have a shape of a circular shape, an elliptical shape, or the like. The display panel DP may include an angled corner and/or a curved corner. For convenience of description, in FIG. 1, a case where the display panel DP may be a rectangular shape having a pair of long sides and a pair of short sides is shown, an extension direction of the long side may be indicated as a first direction DR1, an extension direction of the short side may be indicated as a second direction DR2, and a direction perpendicular to the extension directions of the long side and the short side may be indicated as a third direction DR3.

The display panel DP may display an image. As the display panel DP, a display panel capable of self-luminescence such as an inorganic light emitting display panel using an inorganic light emitting diode as a light emitting element, an ultra-small light emitting diode display panel (a microscale LED display panel or a nano-scale LED display panel) using a small light emitting diode as small as a micro-scale (or nano-scale) as a light emitting element, and a quantum dot light emitting display panel (QD LED panel) using a quantum dot and an inorganic light emitting diode may be used. As the display panel DP, an organic light emitting display panel (OLED panel) using an organic light emitting diode as a light emitting element, a liquid crystal display panel (LCD panel), an electrophoretic display panel (EPD panel), and a non-luminous display panel such as an electrowetting display panel (EWD panel) may be used.

The display panel DP and a substrate SUB for forming the display panel DP may include a display area DA for displaying an image and a non-display area NDA except for the display area DA. The display area DA may configure a screen on which the image may be displayed, and the non-display area NDA may be a remaining area except for the display area DA. According to an embodiment, a shape of the display area DA and a shape of the non-display area NDA may be relatively designed.

Pixels PXL may be disposed in the display area DA on the substrate SUB. For example, the display area DA may include pixel areas in which each pixel PXL may be disposed.

The non-display area NDA may be disposed around the display area DA. Various lines, pads, and/or built-in circuits connected to the pixels PXL of the display area NDA may be disposed in the non-display area NDA.

The display panel DP may include the substrate SUB (or a base layer) and the pixels PXL. The pixels PXL may be provided or disposed on the substrate SUB.

The substrate SUB may be formed of an insulating material such as glass or resin. The substrate SUB may be formed of a material having flexibility to be bent or folded, and may have a single-layer structure or a multi-layer structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring the substrate SUB is not limited to the above-described embodiments.

Each of the pixels PXL may be a minimum unit for displaying an image. The pixels PXL may include a light emitting element emitting white light and/or color light. Each of the pixels PXL may emit any color among red, green, and blue, but are not limited thereto, and may emit cyan, magenta, yellow, or the like. The light emitting element may be, for example, an inorganic light emitting diode including an inorganic light emitting material. However, the light emitting element is not limited thereto, and for example, the light emitting element may be an organic light emitting diode.

The pixels PXL may be arranged in a matrix form along a row extending in the first direction DR1 and a column extending in the second direction DR2 crossing the first direction DR1. However, an arrangement form of the pixels PXL is not particularly limited, and the pixels PXL may be arranged in various forms. The pixels PXL have a rectangular shape in the drawing, but the disclosure is not limited thereto, and the pixels PXL may be modified into various shapes. In case that multiple pixels PXL are provided, the pixels PXL may be provided to have different areas (or sizes). For example, in a case of pixels PXL having different colors of emitted light, the pixels PXL may be provided in different areas (or sizes) or in different shapes for each color.

The pixel PXL may be configured as an active pixel, but is not limited thereto. For example, the pixel PXL may be configured as a pixel of a passive or active light emitting display device of various structures and/or driving methods.

Figure 2:
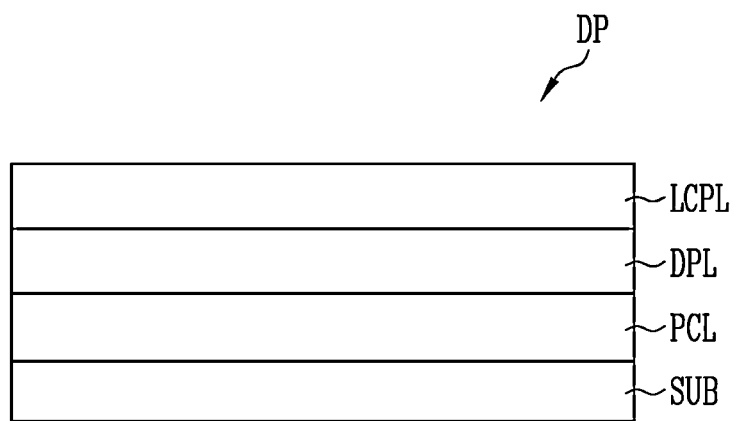
FIG. 2 is a schematic cross-sectional view schematically illustrating the display device of FIG. 1.

FIG. 2 is a schematic cross-sectional view schematically illustrating the display device of FIG. 1.

Referring to FIGS. 1 and 2, the display panel DP may include a pixel circuit layer PCL, a display element layer DPL, and a light conversion pattern layer LCPL sequentially disposed on the substrate SUB.

The pixel circuit layer PCL may be provided on the substrate SUB and may include transistors and signal lines connected to the transistor. For example, each transistor may have a form in which a semiconductor layer, a gate electrode, and a source/drain electrode may be sequentially stacked on each other with an insulating layer interposed therebetween. The semiconductor layer may include amorphous silicon, poly silicon, low temperature poly silicon, an oxide semiconductor, an organic semiconductor, or a combination thereof. The gate electrode and the source/drain electrode may include at least one of aluminum (Al), copper (Cu), titanium (Ti), and molybdenum (Mo), but the disclosure is not limited thereto. The pixel circuit layer PCL may include one or more insulating layers.

A display element layer DPL may be disposed on the pixel circuit layer PCL. The display element layer DPL may include a light emitting element emitting light. The light emitting element may be, for example, an inorganic light emitting element including an inorganic light emitting material. However, the light emitting element is not limited thereto, and for example, the light emitting element may be an organic light emitting diode.

According to an embodiment, a thin layer encapsulation layer may be selectively disposed on the display element layer DPL. The thin layer encapsulation layer may be an encapsulation substrate or may have a form of an encapsulation layer formed of multiple layers. In case that the thin layer encapsulation layer has the form of the encapsulation layer, the thin layer encapsulation layer may include an inorganic layer and/or an organic layer. For example, the thin layer encapsulation layer may have a form in which an inorganic layer, an organic layer, and an inorganic layer may be sequentially stacked on each other. The thin layer encapsulation layer may prevent external air and moisture from penetrating into the display element layer DPL and the pixel circuit layer PCL.

The light conversion pattern layer LCPL may be disposed on the display element layer DPL. The light conversion pattern layer LCPL may change a wavelength (or a color) of light emitted from the display element layer DPL by using a quantum dot, and may selectively transmit light of a specific wavelength (or a specific color) by using a color filter. The light conversion pattern layer LCPL may be formed on a base surface provided by the display element layer DPL through a successive process or may be formed through an adhesion process using an adhesive layer.

The light conversion pattern layer LCPL may be provided separately from the display element layer DPL, but the disclosure is not limited thereto. For example, the light emitting element provided in the display element layer DPL may be implemented as a light emitting element (a quantum dot display element) that emits light by changing the wavelength of light emitted using a quantum dot.

Figure 3A:
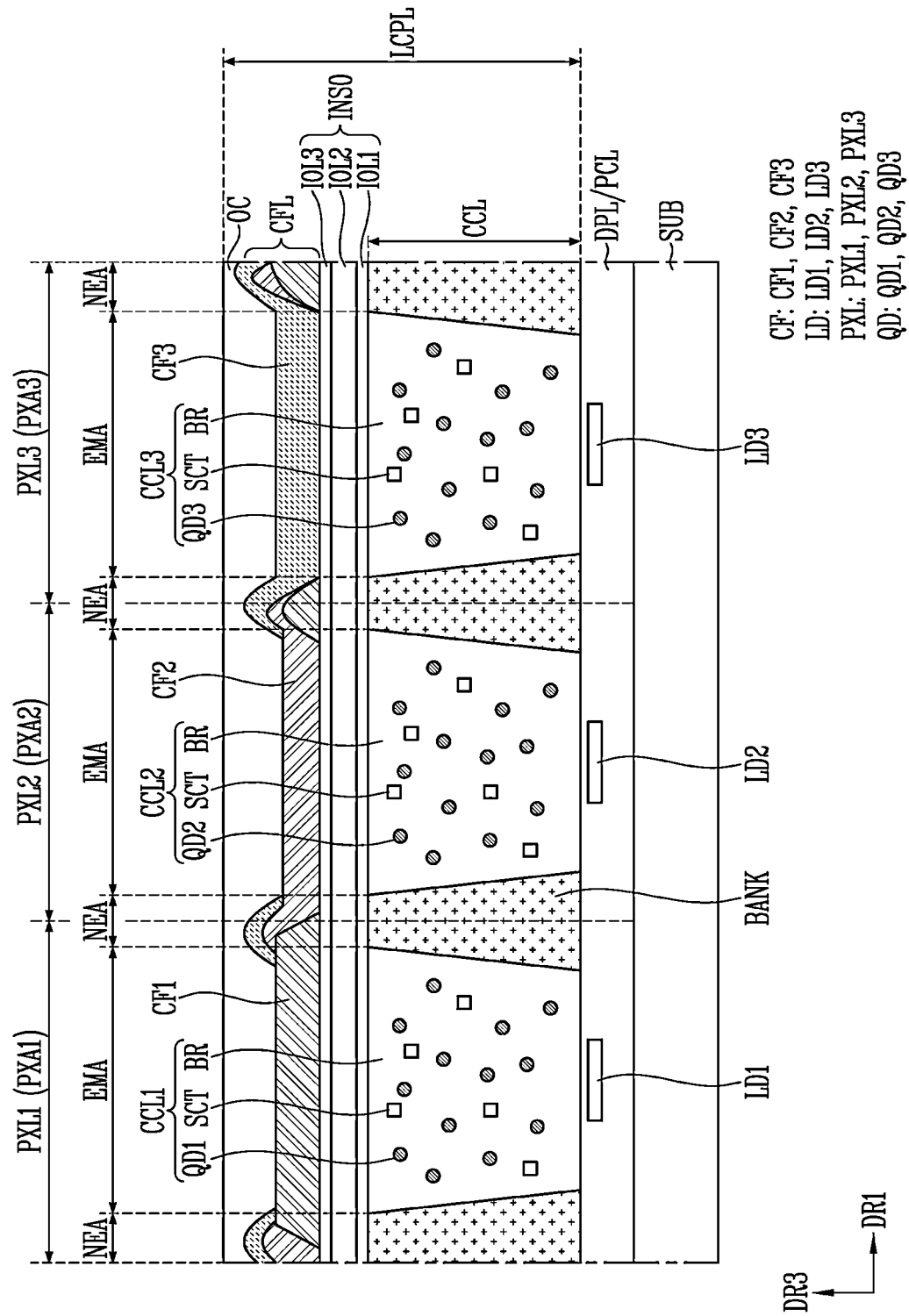
FIGS. 3A to 3C are schematic cross-sectional views illustrating an embodiment of the display device of FIG. 1.
Figure 3B:
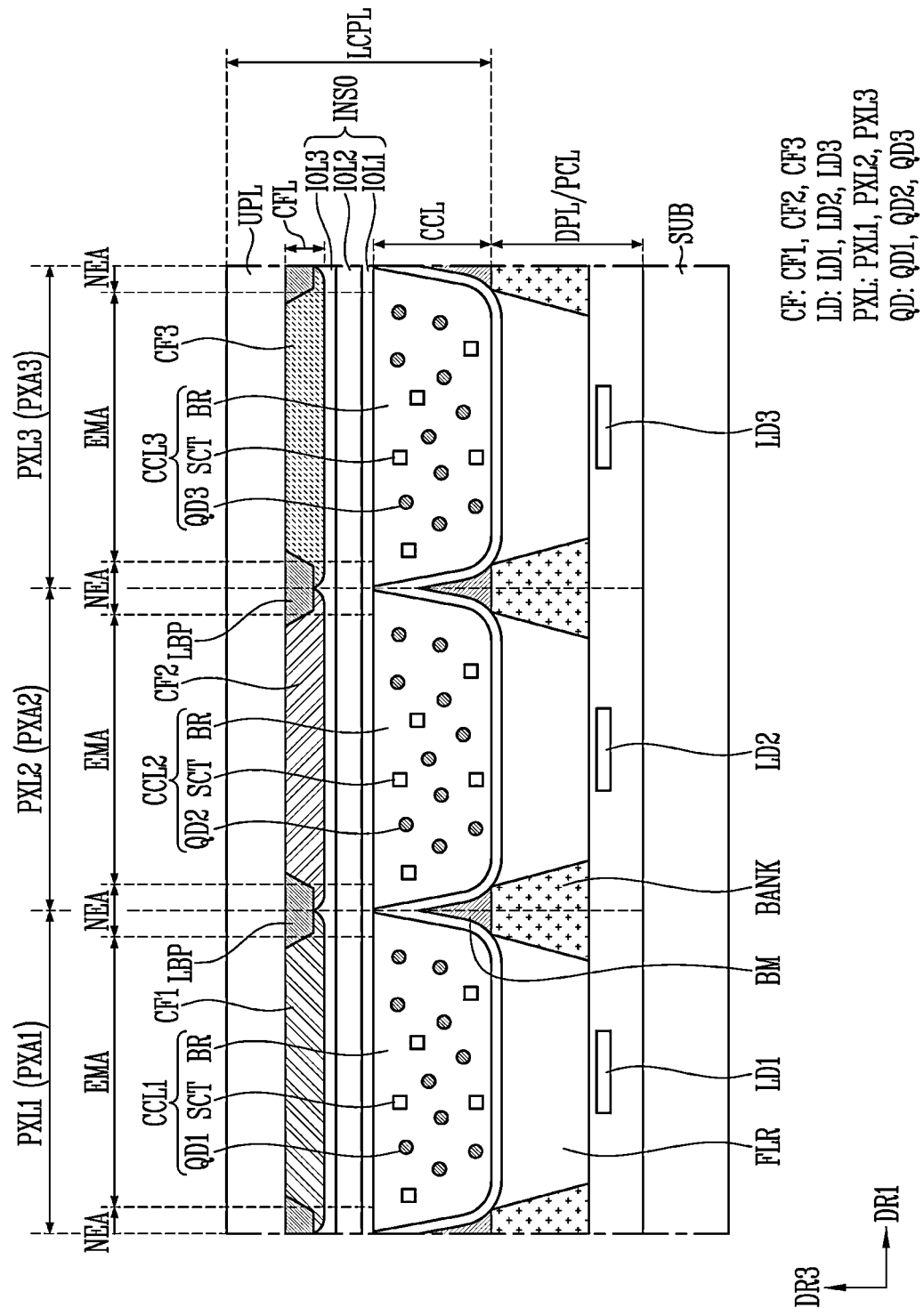
Figure 3C:
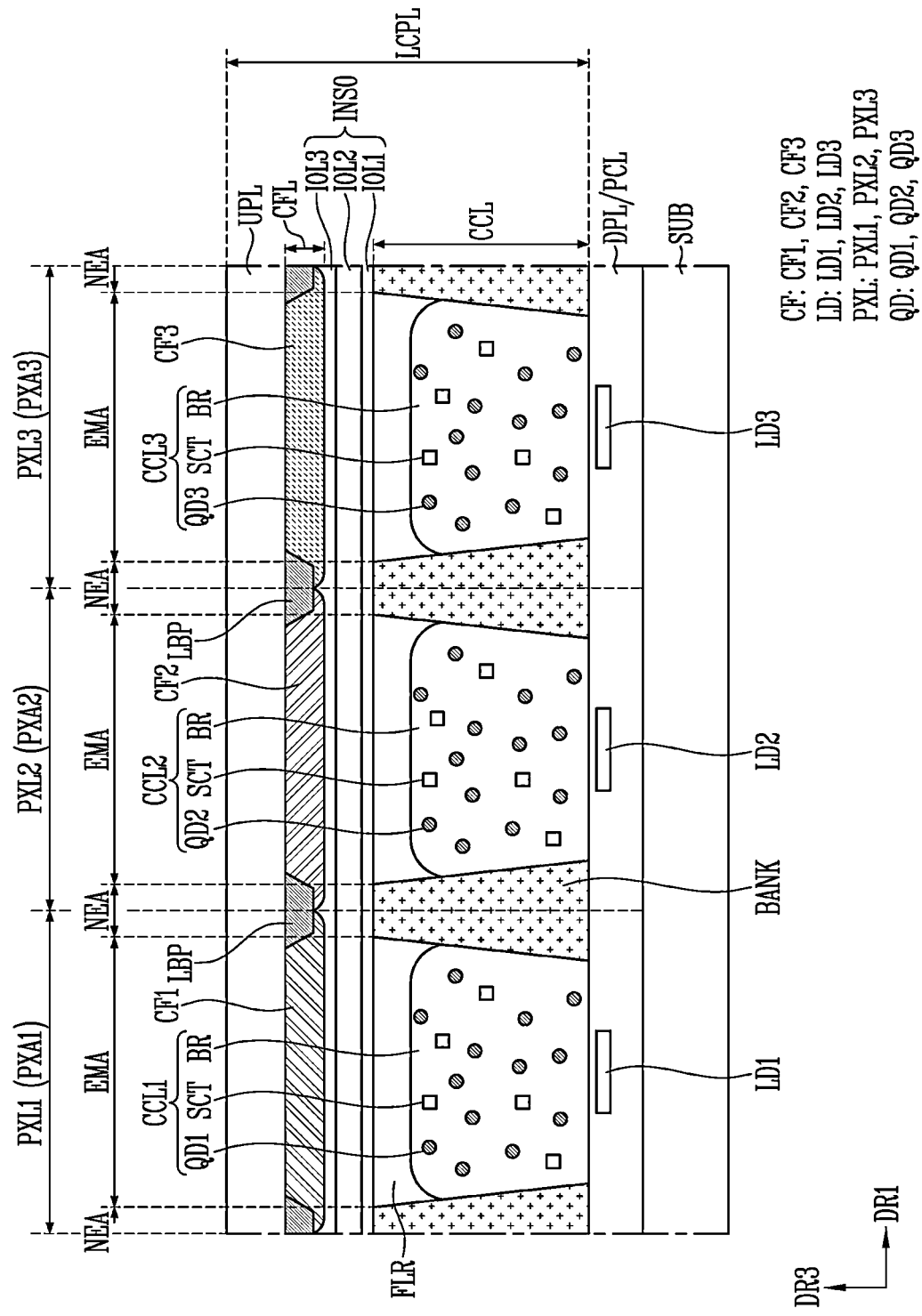

FIGS. 3A to 3C are schematic cross-sectional views illustrating an embodiment of the display device of FIG. 1. FIGS. 3A to 3C briefly show the display device based on the display area DA.

First, referring to FIGS. 1 to 3A, a first pixel PXL1, a second pixel PXL2, and a third pixel PXL3 may be disposed on the substrate SUB. The first to third pixels PXL1, PXL2, and PXL3 may configure a unit pixel, but the disclosure is not limited thereto.

According to an embodiment, the first to third pixels PXL1, PXL2, and PXL3 may emit light of different colors. For example, the first pixel PXL1 may be a red pixel emitting red light, the second pixel PXL2 may be a green pixel emitting green light, and the third pixel PXL3 may be a blue pixel emitting blue light. However, the color, type, number, and/or the like of pixels configuring the unit pixel is/are not particularly limited, and, for example, the color of light emitted by each of the pixels may be variously changed. According to an embodiment, the first to third pixels PXL1, PXL2, and PXL3 may emit light of the same color. For example, each of the first to third pixels PXL1, PXL2, and PXL3 may be a blue pixel emitting blue light.

In an embodiment of the disclosure, unless otherwise specified, "formed and/or provided on the same layer" may mean formed in the same process, and "formed and/or provided on different layers" may mean formed in different processes.

The pixel circuit layer PCL and the display element layer DPL may be disposed on the substrate SUB. For convenience of description, the pixel circuit layer PCL is shown together with the display element layer DPL, but as described with reference to FIG. 2, the pixel circuit layer PCL may be disposed between the substrate SUB and the display element layer DPL.

The display element layer DPL may include a light emitting element LD provided in each emission area EMA. For example, a first light emitting element LD1 may be provided in a first pixel area PXA1, a second light emitting element LD2 may be provided in a second pixel area PXA2, and a third light emitting element LD3 may be provided in a third pixel area PXA3.

The light emitting element LD may be formed of an organic light emitting diode, or an inorganic light emitting diode such as a micro light emitting diode or a quantum dot light emitting diode. In an embodiment, the light emitting element LD may be an ultra-small light emitting diode, for example, having a size as small as a nano-scale to a micro-scale, using a material of an inorganic crystal structure. The light emitting elements LD may be connected to each other in parallel and/or in series with the light emitting element LD disposed adjacent to each other in each pixel PXL, but the disclosure is not limited thereto. The light emitting element LD may configure a light source of each pixel PXL. In other words, each pixel PXL may include at least one light emitting element LD driven by a signal (for example, a scan signal and a data signal) and/or power (for example, first driving power and second driving power).

A detailed configuration of the pixel circuit layer PCL and the display element layer DPL is described later with reference to FIG. 4.

The light conversion pattern layer LCPL may include a color conversion layer CCL, an insulating layer INS0 (or a refractive index conversion layer), a color filter layer CFL (or a color filter CF), and an overcoat layer OC.

The color conversion layer CCL may include a bank BANK and first, second, and third color conversion patterns CCL1, CCL2, and CCL3 (or first, second, and third color conversion layers).

The bank BANK may be disposed on the display element layer DPL.

The bank BANK may be positioned in a non-emission area NEA of the first to third pixels PXL1, PXL2, and PXL3. The bank BANK may be formed between the first to third pixels PXL1, PXL2, and PXL3 to surround each emission area EMA, and may define each emission area EMA of each of the first to third pixels PXL1, PXL2, and PXL3. The bank BANK may prevent a solution for forming the first, second, and third color conversion patterns CCL1, CCL2, and CCL3 in the emission area EMA from flowing into the emission area EMA of an adjacent pixel, or may function as a dam structure that controls an amount of solution to be supplied to each emission area EMA.

A thickness (e.g., a maximum thickness) of the bank BANK may be within a range of about 4 μm to about 20 μm, and for example, the thickness of the bank BANK may be about 10 μm.

An opening for exposing the display element layer DPL may be formed in the bank BANK to correspond to the emission area EMA.

The first, second, and third color conversion patterns CCL1, CCL2, and CCL3 may be disposed in each opening of the bank BANK.

The first, second, and third color conversion patterns CCL1, CCL2, and CCL3 may include a base resin BR, color conversion particles QD, and light scattering particles SCT.

The base resin BR may have high light transmittance and an excellent dispersion characteristic for the color conversion particles QD. For example, the base resin BR may include an organic material such as an epoxy-based resin, an acryl-based resin, a cardo-based resin, an imide-based resin, or a combination thereof.

The color conversion particles QD may convert light of a color emitted from the light emitting element LD disposed in a pixel into light of a specific color. For example, in case that the first pixel PXL1 is a red pixel, the first color conversion layer CCL1 may include first color conversion particles QD1 of a red quantum dot converting light emitted from the first light emitting element LD1 into red light. As another example, in case that the second pixel PXL2 is a green pixel, the second color conversion layer CCL2 may include second color conversion particles QD2 of a green quantum dot converting light emitted from the second light emitting element LD2 into green light. As still another example, in case that the third pixel PXL3 is a blue pixel, the third color conversion layer CCL3 may include third color conversion particles QD3 of a blue quantum dot converting light emitted from the third light emitting device LD3 into blue light. In other embodiments, in case that the third light emitting element LD3 emits blue light, the third color conversion layer CCL3 may not include the third color conversion particles QD3.

The light scattering particles SCT may have a refractive index different from that of the base resin BR and form an optical interface with the base resin BR. The light scattering particles SCT may be metal oxide particles or organic particles. According to an embodiment, the light scattering particles SCT may be omitted.

The insulating layer INS0 may be disposed on the color conversion layer CCL. The insulating layer INS0 may be entirely disposed on the substrate so as to cover the color conversion layer CCL (for example, the bank BANK and the first, second, and third color conversion patterns CCL1, CCL2, and CCL3).

The insulating layer INS0 may include at least three inorganic insulating layers, and may recycle light (for example, light proceeding in an oblique direction) emitted from the color conversion layer CCL using a refractive index difference (or total reflection due to the refractive index difference) between the three inorganic insulating layers. For example, the light totally reflected by the insulating layer INS0 may be reflected again in the third direction DR3 by the display element layer DPL (or an electrode included in the display element layer DPL and having a specific reflectance), or may be scattered in the third direction DR3 by the color conversion layer CCL (for example, the light scattering particle SCT). Therefore, efficiency (external quantum efficiency, or light output efficiency) of light finally emitted from the pixel PXL through the insulating layer INS0 or an emission luminance of the pixel PXL may be improved.

In embodiments, the insulating layer INS0 may include a first inorganic layer IOL1 (or a first dense film), a second inorganic layer IOL2 (or a low refractive film), and a third inorganic layer IOL3 (or a second dense film) sequentially stacked on the color conversion layer CCL.

The first inorganic layer IOL1 may be disposed on the color conversion layer CCL, and may prevent moisture (or a solution used in a subsequent process) from penetrating into the color conversion layer CCL thereunder. The second inorganic layer IOL2 may be disposed on the first inorganic layer IOL1, and may totally reflect the light (for example, the light proceeding in an oblique direction) emitted from the color conversion layer CCL using a refractive index difference with the first inorganic layer IOL1. The third inorganic layer IOL3 may be disposed on the second inorganic layer IOL2 and may improve adhesion force between the second inorganic layer IOL2 and the color filter layer CFL thereon.

Each of the first inorganic layer IOL1, the second inorganic layer IOL2, and the third inorganic layer IOL3 may include an inorganic material, and for example, each of the first inorganic layer IOL1, the second inorganic layer IOL2, and the third inorganic layer IOL3 may include silicon nitride ($SiN_x$), silicon oxide ($SiO_x$), silicon oxynitride (SiON), or a combination thereof. As will be described later, the first inorganic layer IOL1, the second inorganic layer IOL2, and the third inorganic layer IOL3 may be formed through a chemical vapor deposition technique, and thus, the first inorganic layer IOL1, the second inorganic layer IOL2, and the third inorganic layer IOL3 may include a hydrogen impurity (for example, hydrogenated amorphous silicon (a-Si:H)).

In an embodiment, a second refractive index of the second inorganic layer IOL2 may be less than a first refractive index of the first inorganic layer IOL1, and a third refractive index of the third inorganic layer IOL3 may be greater than the second refractive index of the second inorganic layer IOL2. For example, for total reflection, the second refractive index of the second inorganic layer IOL2 may be less than the first refractive index of the first inorganic layer IOL1 by about 0.15 or more or about 0.3 or more. The third refractive index of the third inorganic layer IOL3 may be greater than the second refractive index of the second inorganic layer IOL2 by about 0.25 or more so that the light transmitting the second inorganic layer IOL2 proceeds in the third direction DR3. For example, the first refractive index of the first inorganic layer IOL1 may be greater than or equal to about 1.6, the second refractive index of the second inorganic layer IOL2 may be within a range of about 1.1 to about 1.45 or about 1.1 to about 1.3, and the third refractive index of the third inorganic layer IOL3 may be within a range of about 1.45 to about 1.8. For example, the first refractive index of the first inorganic layer IOL1 may be about 1.6, and the second refractive index of the second inorganic layer IOL2 may be about 1.2.

In an embodiment, a second porosity of the second inorganic layer IOL2 may be greater than a first porosity of the first inorganic layer IOL1, and a third porosity of the third inorganic layer IOL3 may be less than the second porosity of the second inorganic layer IOL2. Here, the porosity indicates a ratio of a volume occupied by a pore (or an air gap) to a total volume in a corresponding inorganic layer. For example, the first porosity of the first inorganic layer IOL1 may be less than or equal to about 5%, the second porosity of the second inorganic layer IOL2 may be within a range of about 20% to about 80%, and the third porosity of the third inorganic layer IOL3 may be less than or equal to about 20%. As the porosity increases, the refractive index may decrease.

The insulating layer INS0 including the first, second, and third inorganic layers IOL1, IOL2, and IOL3 having different refractive indices (and different porosities) may be formed by differentiating deposition conditions (for example, temperature conditions, power conditions, and the like) or deposition speeds of the chemical vapor deposition technique.

Since the first, second, and third inorganic layers IOL1, IOL2, and IOL3 may include the same material (for example, inorganic material), coupling force between the first, second, and third inorganic layers IOL1, IOL2, and IOL3 may be improved, and a risk of peeling of the second inorganic layer IOL2 (for example, a risk of peeling of a low refractive layer in case that the low refractive layer corresponding to the second inorganic layer IOL2 is formed using an inorganic filler dispersed in an organic material) may be removed.

Since the insulating layer INS0 may be formed using one deposition technique (for example, the chemical vapor deposition method), a manufacturing process may be simplified compared to a case where the insulating layer INS0 may be formed using other deposition techniques (for example, a chemical vapor deposition method, a sputtering method, or an inkjet method).

Furthermore, a manufacturing cost may be reduced compared to a case where the insulating layer INS0 may be formed (or the low refractive layer corresponding to the second inorganic layer IOL2) using an expensive inorganic filter (for example, hollow silica) having a low refractive index.

The color filter layer CFL may be disposed on the insulating layer INS0.

The color filter layer CFL may include a color filter material that selectively transmits light of a specific color converted by the color conversion layer CCL. The color filter layer CFL may include a red color filter, a green color filter, and a blue color filter. For example, in case that the first pixel PXL1 is a red pixel, a first color filter CF1 that transmits red light may be disposed on the first pixel PXL1. In case that the second pixel PXL2 is a green pixel, a second color filter CF2 that transmits green light may be disposed on the second pixel PXL2. In case that the third pixel PXL3 is a blue pixel, a third color filter CF3 that transmits blue light may be disposed on the third pixel PXL3.

The overcoat layer OC may be disposed on the color filter layer CFL. The overcoat layer OC may be entirely disposed on the substrate SUB to cover a lower configuration, and may encapsulate the display area DA of the display panel DP (refer to FIG. 1).

In an embodiment, the overcoat layer OC may be configured of a single layer or multiple layers including at least one organic layer and/or inorganic layer. For example, the overcoat layer OC may be configured of multiple layers including at least one inorganic layer disposed on the color filter layer CFL and at least one organic layer stacked on the inorganic layer. The overcoat layer OC may selectively further include at least one inorganic layer disposed on the organic layer. However, a structure of the overcoat layer OC is not limited thereto. For example, in another embodiment, the overcoat layer OC may be configured of only multiple inorganic layers. A configuration material and/or the structure of the overcoat layer OC may be variously changed according to an embodiment.

As described above, the display device may include the insulating layer INS0 disposed on the color conversion layer CCL, and the insulating layer INS0 may include the first inorganic layer IOL1, the second inorganic layer IOL2, and the third inorganic layer IOL3 having mutually different refractive indices (and mutually different porosities). Since the first, second, and third inorganic layers IOL1, IOL2, and IOL3 may include the same material (for example, inorganic material), the coupling force between the first, second, and third inorganic layers IOL1, IOL2, and IOL3 may be improved. Since the insulating layer INS0 including the first, second, and third inorganic layers IOL1, IOL2, and IOL3 may be formed using a single deposition technique (for example, the chemical vapor deposition method), a manufacturing process may be simplified. Since an expensive inorganic filler (for example, hollow silica) may not be used, a manufacturing cost may be reduced.

In FIG. 3A, the light conversion pattern layer LCPL may be formed on the base surface provided by the display element layer DPL through a successive process, but the light conversion pattern layer LCPL is not limited thereto.

For example, as shown in FIG. 3B, the color filter layer CFL, the insulating layer INS0, and the color conversion layer CCL may be formed on a surface of an upper substrate UPL, and the light conversion pattern layer LCPL may be disposed on the display element layer DPL through an adhesion process using an adhesive layer (for example, a filler FLR).

The upper substrate UPL may be a rigid or flexible substrate (or film). In an embodiment, in case that the upper substrate UPL is a rigid substrate, the upper substrate UPL may be at least one of a glass substrate, a quartz substrate, a glass ceramic substrate, and a crystalline glass substrate. In another embodiment, in case that the upper substrate UPL is a flexible substrate, the upper substrate UPL may be at least one of a film substrate and a plastic substrate including a polymer organic material. The upper substrate UPL may include fiber glass reinforced plastic (FRP).

A light blocking member LBP may be disposed between the first to third color filters CF1 to CF3. The light blocking member LBP may include at least one black matrix material (for example, at least one light blocking material) among various types of black matrix materials, a color filter material of a specific color, and/or the like.

According to an embodiment, a pattern capable of blocking light may be additionally disposed between the first to third color conversion patterns CCL1 to CCL3. For example, a black matrix pattern BM may be disposed between the first to third color conversion patterns CCL1 to CCL3.

As another example, as shown in FIG. 3C, the color filter layer CFL and the insulating layer INS0 may be formed on a surface of the upper substrate UPL, and the insulating layer INS0 may be disposed on the color conversion layer CCL through an adhesion process using an adhesive layer (for example, a filler FLR).

As still another example, the color filter layer CFL may be formed on a surface of the upper substrate UPL, and the color filter layer CFL may be disposed on the insulating layer INS0 through an adhesion process using an adhesive layer. In other words, the adhesive layer may be disposed between the color filter layer CFL and the insulating layer INS0.

Figure 4:
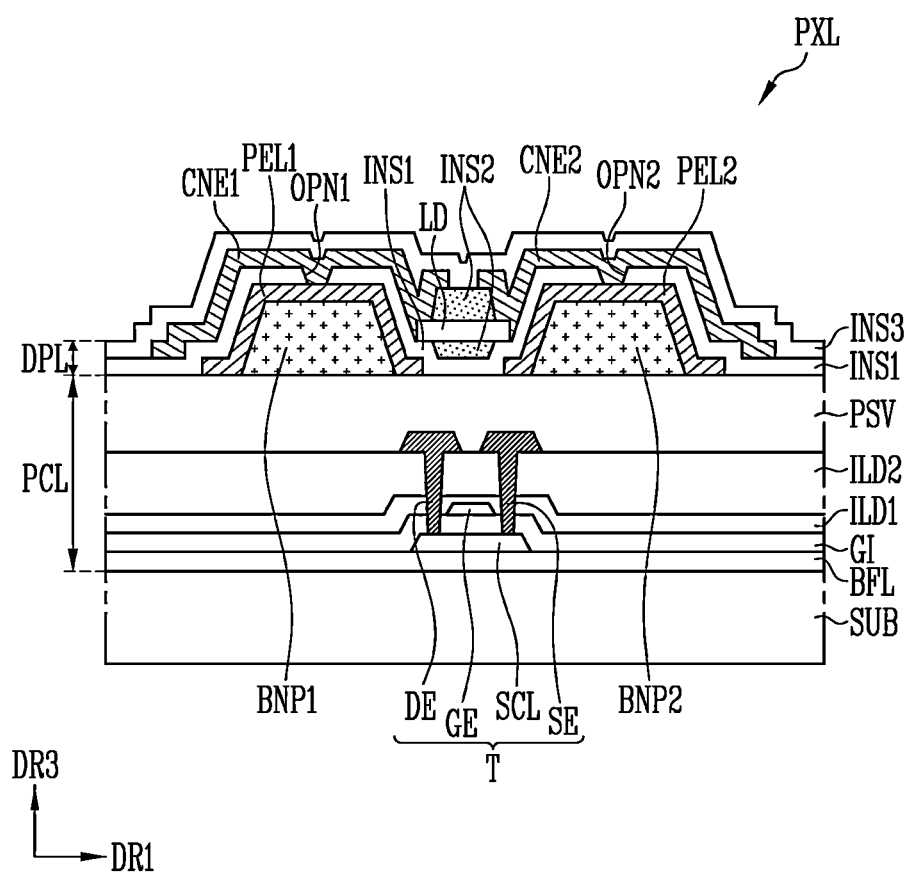
FIG. 4 is a schematic cross-sectional view illustrating an embodiment of a pixel circuit layer and a display element layer included in the display device of FIGS. 3A to 3C.

FIG. 4 is a schematic cross-sectional view illustrating an embodiment of the pixel circuit layer and the display element layer included in the display device of FIGS. 3A to 3C. In FIG. 4, a pixel PXL is simplified, such as showing each electrode as a single-layer electrode and each insulating layer as only a single-layer insulating layer, but the disclosure is not limited thereto.

In the disclosure, "connection" between two elements may mean that both an electrical connection and a physical connection are used inclusively.

Referring to FIGS. 1 to 4, each pixel PXL may include the pixel circuit layer PCL and the display element layer DPL disposed on the substrate SUB.

For convenience, the pixel circuit layer PCL is described first, and then the display element layer DPL is described.

The pixel circuit layer PCL may include a buffer layer BFL, a transistor T, and a protection layer PSV.

The buffer may be provided and/or formed on the substrate SUB, and may prevent an impurity from diffusing into the transistor T. The buffer layer BFL may be an inorganic insulating layer including an inorganic material. The buffer layer BFL may include at least one of a metal oxide such as silicon nitride ($SiN_x$), silicon oxide ($SiO_x$), silicon oxynitride ($SiO_xN_y$), or aluminum oxide ($AlO_x$). The buffer layer BFL may be provided as a single layer, or may be provided as multiple layers (e.g., at least a double layer). In case that the buffer layer BFL is provided as multiple layers, each layer may be formed of the same material or different materials. The buffer layer BFL may be omitted according to a material, a process condition, and the like of the substrate SUB.

The transistor T may be a driving transistor that controls a driving current provided to the light emitting element LD. However, the disclosure is not limited thereto, and the transistor T may be a switching transistor that transmits a signal to the driving transistor or performs another function in addition to the driving transistor.

The transistor T may include a semiconductor pattern SCL, a gate electrode GE, a first terminal SE, and a second terminal DE. The first terminal SE may be one of a source electrode and a drain electrode, and the second terminal DE may be the other electrode. For example, in case that the first terminal SE is a source electrode, the second terminal DE may be a drain electrode.

The semiconductor pattern SCL may be provided and/or formed on the buffer layer BFL. The semiconductor pattern SCL may include a first contact region contacting the first terminal SE and a second contact region contacting the second terminal DE. A region between the first contact region and the second contact region may be a channel region. The channel region may overlap the gate electrode GE of the corresponding transistor T. The semiconductor pattern SCL may be a semiconductor pattern formed of amorphous silicon, poly silicon, low temperature poly silicon, an oxide semiconductor, an organic semiconductor, or the like, or a combination thereof. The channel region may be, for example, a semiconductor pattern that may not be doped with an impurity, and may be an intrinsic semiconductor. The first contact region and the second contact region may be semiconductor patterns doped with an impurity.

The gate electrode GE may be provided and/or formed on a gate insulating layer GI to correspond to the channel region of the semiconductor pattern SCL. The gate electrode GE may be provided on the gate insulating layer GI and may overlap the channel region of the semiconductor pattern SCL. The gate electrode GE may be formed in a single layer of one or more materials selected from a group of copper (Cu), molybdenum (Mo), tungsten (W), aluminum neodymium (AlNd), titanium (Ti), aluminum (Al), silver (Ag), and an alloy thereof alone or a mixture thereof, or may be formed in a double layer or multi-layer structure of a molybdenum (Mo), titanium (Ti), copper (Cu), aluminum (Al), silver (Ag), or a combination thereof, which may be a low-resistance material, to reduce a line resistance.

The gate insulating layer GI may be an inorganic insulating layer including an inorganic material. For example, the gate insulating layer GI may include at least one of a metal oxide such as silicon nitride (SiNx), silicon oxide (SiOx), silicon oxynitride (SiOxNy), and aluminum oxide (AlOx). However, the material of the gate insulating layer GI is not limited to the above-described embodiments, and various materials providing insulation to the gate insulating layer GI may be applied according to an embodiment. For example, the gate insulating layer GI may be formed of an organic insulating layer including an organic material. The gate insulating layer GI may be provided as a single layer, but may also be provided as multiple layers (e.g., at least a double layer).

Each of the first terminal SE and the second terminal DE may be provided and/or formed on the second interlayer insulating layer ILD2, and may be in contact with the first contact region and the second contact region of the semiconductor pattern SCL through a contact hole sequentially passing through the gate insulating layer GI and first and second interlayer insulating layers ILD1 and ILD2. For example, the first terminal SE may be in contact with the first contact region of the semiconductor pattern SCL, and the second terminal DE may be in contact with the second contact region of the semiconductor pattern SCL. Each of the first and second terminals SE and DE may include the same material as the gate electrode GE, or may include one or more materials selected from materials given as examples as a configuration material of the gate electrode GE.

The first interlayer insulating layer ILD1 may include the same material as the gate insulating layer GI, or may include one or more materials selected from materials given as examples as a configuration material of the gate insulating layer GI.

The second interlayer insulating layer ILD2 may be provided and/or formed on the first interlayer insulating layer ILD1. The second interlayer insulating layer ILD2 may be an inorganic insulating layer including an inorganic material or an organic insulating layer including an organic material. According to an embodiment, the second interlayer insulating layer ILD2 may include the same material as the first interlayer insulating layer ILD1, but the disclosure is not limited thereto. The second interlayer insulating layer ILD2 may be provided as a single layer, or may be provided as multiple layers (e.g., at least a double layer). According to an embodiment, the second interlayer insulating layer ILD2 may be omitted.

In the above-described embodiment, the first and second terminals SE and DE of the transistor T may be separate electrodes electrically connected to the semiconductor pattern SCL through the contact hole sequentially passing through the gate insulating layer GI and the first and second interlayer insulating layers ILD1 and ILD2, but the disclosure is not limited thereto. According to an embodiment, the first terminal SE of the transistor T may be a first contact region adjacent to the channel region of the semiconductor pattern SCL, and the second terminal DE of the transistor T may be a second contact region adjacent to the channel region of the semiconductor pattern SCL. The second terminal DE of the transistor T may be electrically connected to the light emitting element LD of the pixel PXL through a separate connection means such as a bridge electrode.

The transistor T may be configured of a low temperature polysilicon thin film transistor (LTPS TFT), but the disclosure is not limited thereto. According to an embodiment, the transistors T may be configured of an oxide semiconductor thin film transistor. Although a case in which the transistor T may be a thin film transistor of a top gate structure has been described as an example in the above-described embodiment, the disclosure is not limited thereto, and a structure of the transistor T may be variously changed. For example, the transistor T may be a thin film transistor having a bottom gate structure.

The pixel circuit layer PCL may further include a storage capacitor storing a voltage applied between a gate electrode and the first terminal SE (or the source electrode) of the transistor T, a driving voltage line providing a driving voltage to the transistor T (or the pixel PXL), and the like.

The protective layer PSV may be provided and/or formed on the transistor T.

The protective layer PSV may be provided in a form including an organic insulating layer, an inorganic insulating layer, or an organic insulating layer disposed on an inorganic insulating layer. The inorganic insulating layer may include for example, at least one of a metal oxide such as silicon oxide ($SiO_x$), silicon nitride ($SiN_x$), silicon oxynitride ($SiO_xN_y$), and aluminum oxide ($AlO_x$). The organic insulating layer may include, for example, at least one of acrylic resin (polyacrylates resin), epoxy resin, phenolic resin, polyamides resin, polyimide resin, unsaturated polyesters resin, poly-phenylen ethers resin, poly-phenylene sulfides resin, and benzocyclobutene resin.

The display element layer DPL may be provided on the protective layer PSV.

The display element layer DPL may include first and second bank patterns BNP1 and BNP2, first and second pixel electrodes PEL1 and PEL2, the light emitting element LD, and first and second contact electrodes CNE1 and CNE2. The display element layer DPL may include first to third insulating layers INS1 to INS3.

The first and second bank patterns BNP1 and BNP2 may be positioned in the emission area EMA (refer to FIGS. 3A to 3C) and may be spaced apart from each other. The first and second bank patterns BNP1 and BNP2 may be support members that support each of the first and second pixel electrodes BNP1 and BNP2 to change a surface profile (or a shape) of the third direction DR3 of each of the first and second pixel electrodes BNP1 and BNP2 so as to guide light emitted from the light emitting elements LD in an image display direction (for example, a front surface direction) of the display device. For example, the first and second bank patterns BNP1 and BNP2 may change the surface profile (or the shape) of each of the first and second pixel electrodes PEL1 and PEL2 in the third direction DR3.

The first and second bank patterns BNP1 and BNP2 may be provided and/or formed between the protective layer PSV and a corresponding electrode in the emission area of a corresponding pixel PXL. For example, the first bank pattern BNP1 may be provided and/or formed between the protective layer PSV and the first pixel electrode PEL1, and the second bank pattern BNP2 may be provided and/or formed between the protective layer PSV and the second pixel electrode PEL2.

The first and second bank patterns BNP1 and BNP2 may be an inorganic insulating layer including an inorganic material or an organic insulating layer including an organic material. According to an embodiment, the first and second bank patterns BNP1 and BNP2 may include a single organic insulating layer and/or a single inorganic insulating layer, but the disclosure is not limited thereto. According to an embodiment, the first and second bank patterns BNP1 and BNP2 may be provided in a form of multiple layers in which at least one organic insulating layer and at least one inorganic insulating layer may be stacked on each other. However, the material of the first and second bank patterns BNP1 and BNP2 is not limited to the above-described embodiments, and according to an embodiment, the first bank pattern BNP1 may include a conductive material.

The first and second bank patterns BNP1 and BNP2 may have a trapezoidal-shaped cross-section in which a width becomes narrower from a surface (for example, an upper surface) of the protective layer PSV toward an upper portion in the third direction DR3, but the disclosure is not limited thereto. According to an embodiment, the first and second bank patterns BNP1 and BNP2 may include a curved surface having a cross-section of a semi-elliptical shape, a semi-circular shape (or a hemispherical shape). When viewed in a cross-section, the shape of the first and second bank patterns BNP1 and BNP2 is not limited to the above-described embodiments and may be variously changed within a range capable of improving efficiency of the light emitted from each of the light emitting elements LD. The first and second bank patterns BNP1 and BNP2 adjacent in the first direction DR1 may be disposed on the same surface of the protective layer PSV, and may have the same height (or thickness) in the third direction DR3.

In the above-described embodiment, the first and second bank patterns BNP1 and BNP2 may be provided and/or formed on the protective layer PSV, and thus the first and second bank patterns BNP1 and BNP2 and the protective layer PSV may be formed by different processes, but the disclosure is not limited thereto. According to an embodiment, the first and second bank patterns BNP1 and BNP2 and the protective layer PSV may be formed through the same process. The first and second bank patterns BNP1 and BNP2 may be one region of the protective layer PSV.

The first and second pixel electrodes PEL1 and PEL2 may be provided and/or formed on the first and second bank patterns BNP1 and BNP2 corresponding thereto.

Each of the first and second pixel electrodes PEL1 and PEL2 may be formed of a material having a reflectance in order to allow the light emitted from the light emitting element LD to proceed in the image display direction of the display device. Each of the first and second pixel electrodes PEL1 and PEL2 may be formed of a conductive material having a reflectance. The conductive material may include an opaque metal advantageous for reflecting the light emitted from the light emitting element LD in the image display direction of the display device. The opaque metal may include, for example, a metal such as at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. According to an embodiment, each of the first and second pixel electrodes PEL1 and PEL2 may include a transparent conductive material. The transparent conductive material may include a conductive oxide such as indium tin oxide (ITO), indium zinc oxide (IZO), zinc oxide (ZnOx), indium gallium zinc oxide (IGZO), or indium tin zinc oxide (ITZO), a conductive polymer such as poly(3,4-ethylenedioxythiophene) (PEDOT), and the like. The zinc oxide ($ZnO_x$) may be zinc oxide (ZnO), and/or zinc peroxide ($ZnO_2$).

In case that each of the first and second pixel electrodes PEL1 and PEL2 includes a transparent conductive material, a separate conductive material formed of an opaque metal for reflecting the light emitted from the light emitting element LD in the image display direction of the display element layers may be added. However, the material of each of the first and second pixel electrodes PEL1 and PEL2 is not limited to the above-described materials.

Each of the first and second pixel electrodes PEL1 and PEL2 may be provided and/or formed as a single layer, but the disclosure is not limited thereto. According to an embodiment, each of the first and second pixel electrodes PEL1 and PEL2 may be provided and/or formed as multiple layers in which at least two materials among metals, alloys, conductive oxides, and conductive polymers may be stacked on each other. Each of the first and second pixel electrodes PEL1 and PEL2 may be formed of multiple layers (e.g., at least a double layer) to minimize distortion due to a signal delay in case transmitting a signal (or a voltage) to both ends of each of the light emitting elements LD. For example, each of the first and second pixel electrodes PEL1 and PEL2 may be formed in multiple layers in which indium tin oxide (ITO)/silver (Ag)/indium tin oxide (ITO) may be sequentially stacked on each other.

According to an embodiment, the first pixel electrode PEL1 may be electrically connected to the transistor T through a first contact hole passing through the protective layer PSV, and the second pixel electrode PEL2 may be electrically connected to a driving voltage line of the pixel circuit layer PCL through a second contact hole passing through the protective layer PSV.

Each of the first pixel electrode PEL1 and the second pixel electrode PEL2 may receive an alignment signal (or alignment voltage) from a corresponding partial configuration of the pixel circuit layer PCL and may be used as an alignment electrode (or an alignment line) for alignment of the light emitting elements LD. For example, the first pixel electrode PEL1 may receive a first alignment signal (or a first alignment voltage) from a partial configuration of the pixel circuit layer PCL and may be used as a first alignment electrode (or a first alignment line), and the second pixel electrode PEL2 may receive a second alignment signal (or a second alignment voltage) from another configuration of the pixel circuit layer PCL and may be used as a second alignment electrode (or a second alignment line).

After the light emitting element LD may be aligned in the pixel PXL, a portion of the first pixel electrode PEL1 positioned between adjacent pixels PXL may be removed to individually (or independently) drive the pixel PXL.

After the light emitting element LD may be aligned, the first pixel electrode PEL1 and the second pixel electrode PEL2 may be used as driving electrodes for driving the light emitting elements LD.

The light emitting element LD may be an ultra-small light emitting diode, for example, having a size as small as a nano-scale to a micro-scale using a material of an inorganic crystal structure. For example, the light emitting element LD may include a first semiconductor layer, a second semiconductor layer, an active layer, and an insulating layer. The first semiconductor layer may include a semiconductor layer having a type, and the second semiconductor layer may include a semiconductor layer of a type different from that of the first semiconductor layer. For example, the first semiconductor layer may include an N-type semiconductor layer, and the second semiconductor layer may include a P-type semiconductor layer. The first semiconductor layer and the second semiconductor layer may include at least one semiconductor material among InAlGaN, GaN, AlGaN, InGaN, AlN, and InN. The active layer may be positioned between the first semiconductor layer and the second semiconductor layer, and may have a single or multiple quantum well structure. In case that an electric field greater than or equal to a voltage is applied to the ends of the light emitting element LD, an electron-hole pair may be combined in the active layer and light may be emitted.

At least two to tens of light emitting elements LD may be arranged and/or provided in the emission area EMA, but the number of light emitting elements LD arranged and/or provided in the emission area EMA is not limited thereto. According to an embodiment, the number of light emitting elements LD arranged and/or provided in the emission area EMA may be variously changed.

Each of the light emitting elements LD may emit any one of color light and/or white light. In an embodiment, each of the light emitting elements LD may emit blue light of a short wavelength band, but the disclosure is not limited thereto.

The first insulating layer INS1 may be provided and/or formed on the first and second pixel electrodes PEL1 and PEL2.

The first insulating layer INS1 may include an inorganic insulating layer formed of an inorganic material or an organic insulating layer formed of an organic material. The first insulating layer INS1 may be formed of an inorganic insulating layer advantageous for protecting the light emitting element LD from the pixel circuit layer PCL of the pixel PXL. For example, the first insulating layer INS1 may include at least one of a metal oxide such as silicon nitride (SiNx), silicon oxide (SiOx), silicon oxynitride (SiOxNy), and aluminum oxide (AlOx), but the disclosure is not limited thereto. According to an embodiment, the first insulating layer INS1 may be formed of an organic insulating layer advantageous for planarizing a support surface of the light emitting elements LD.

The first insulating layer INS1 may include a first opening OPN1 exposing a region of the first pixel electrode PEL1 and a second opening OPN2 exposing a region of the second pixel electrode PEL2. The first insulating layer INS1 may cover remaining regions except for a region of each of the first and second pixel electrodes PEL1 and PEL2 (for example, the regions corresponding to the first and second openings OPN1 and OPN2). The light emitting elements LD may be disposed (or aligned) on the first insulating layer INS1 between the first pixel electrode PEL1 and the second pixel electrode PEL2.

The second insulating layer INS2 (or a second insulating pattern) may be provided and/or formed on the light emitting element LD. The second insulating layer INS2 may be provided and/or formed on the light emitting element LD to partially cover an outer circumferential surface (or a surface) of the light emitting element LD. The active layer of the light emitting element LD may not be in contact with an external conductive material by the second insulating layer INS2. The second insulating layer INS2 may cover only a portion of the outer peripheral surface (or the surface) of the light emitting element LD to expose the ends of the light emitting element LD to the outside. The second insulating layer INS2 may be formed as an insulating pattern independent of the pixel PXL, but the disclosure is not limited thereto.

The second insulating layer INS2 may be configured of a single layer or multiple layers, and may include an inorganic insulating layer including at least one inorganic material or an organic insulating layer including at least one organic material. According to a design condition or the like of the display device to which the light emitting element LD may be applied, the second insulating layer INS2 may be formed of an inorganic insulating layer including an inorganic material or an organic insulating layer including an organic material. After the alignment of the light emitting element LD in the pixel PXL may be completed, the second insulating layer INS2 may be formed on the light emitting element LD to prevent the light emitting element LD from being separated from an aligned position.

The first contact electrode CNE1 may be provided on the first pixel electrode PEL1 to be in contact with or to be connected to the first pixel electrode PEL1 through the first opening OPN1 of the first insulating layer INS1. According to an embodiment, in case that a capping layer (not shown) is disposed on the first pixel electrode PEL1, the first contact electrode CNE1 may be disposed on the capping layer and may be connected to the first pixel electrode PEL1 through the capping layer. The above-described capping layer may protect the first pixel electrode PEL1 from a defect generated during a manufacturing process of the display device, and may further strengthen adhesion force between the first pixel electrode PEL1 and the pixel circuit layer PCL positioned thereunder. The capping layer may include a transparent conductive material (or substance) such as indium zinc oxide (IZO).

The first contact electrode CNE1 may be provided and/or formed on an end of the light emitting element LD to be connected to the end of the light emitting element LD. Accordingly, the first pixel electrode PEL1 and the end of the light emitting element LD may be electrically connected to each other through the first contact electrode CNE1.

Similar to the first contact electrode CNE1, the second contact electrode CNE2 may be provided on the second pixel electrode PEL2 to be in contact with or to be connected to the second pixel electrode PEL2 through the second opening OPN2 of the first insulating layer INS1. According to an embodiment, in case that a capping layer is disposed on the second pixel electrode PEL2, the second contact electrode CNE2 may be disposed on the capping layer and may be connected to the second pixel electrode PEL2 through the capping layer. The second contact electrode CNE2 may be provided and/or formed on another end of the light emitting element LD to be connected to the another end of the light emitting element LD. Accordingly, the second pixel electrode PEL2 and the another end of the light emitting element LD may be electrically connected to each other through the second contact electrode CNE2.

The first and second contact electrodes CNE1 and CNE2 may be formed of various transparent conductive materials to allow light emitted from the light emitting element LD and reflected by the first and second pixel electrodes PEL1 and PEL2 to proceed in the image display direction of the display device without loss. For example, the first and second contact electrodes CNE1 and CNE2 may include at least one of various transparent conductive materials (or substances) including indium tin oxide (ITO), indium zinc oxide (IZO), zinc oxide ($ZnO_x$), indium gallium zinc oxide (IGZO), indium tin zinc oxide (ITZO), and the like, and may be substantially transparent or translucent to satisfy a light transmittance. However, the material of the first and second contact electrodes CNE1 and CNE2 is not limited to the above-described embodiment. According to an embodiment, the first and second contact electrodes CNE1 and CNE2 may be formed of various opaque conductive materials (or substances). The first and second contact electrodes CNE1 and CNE2 may be formed of a single layer or multiple layers.

A shape of the first and second contact electrodes CNE1 and CNE2 may not be limited to a specific shape, and may be variously changed within a range electrically and stably connected to the light emitting element LD. The shape of the first and second contact electrodes CNE1 and CNE2 may be variously changed in consideration of a connection relationship with electrodes disposed thereunder.

The first and second contact electrodes CNE1 and CNE2 may be disposed to be spaced apart from each other in the first direction DR1. For example, the first contact electrode CNE1 and the second contact electrode CNE2 may be disposed to be spaced apart from each other with a distance therebetween on the second insulating layer INS2. The first contact electrode CNE1 and the second contact electrode CNE2 may be provided on the same layer and formed through the same process. However, the disclosure is not limited thereto, and according to an embodiment, the first and second contact electrodes CNE1 and CNE2 may be provided on different layers and may be formed through different processes.

The third insulating layer INS3 may be provided and/or formed on the first and second contact electrodes CNE1 and CNE2. The third insulating layer INS3 may be an inorganic insulating layer including an inorganic material or an organic insulating layer including an organic material. For example, the third insulating layer INS3 may have a structure in which at least one inorganic insulating layer or at least one organic insulating layer may be alternately stacked on each other. The third insulating layer INS3 may entirely cover the display element layer DPL to prevent water or moisture from flowing into the display element layer DPL including the light emitting elements LD from the outside.

Figure 5:
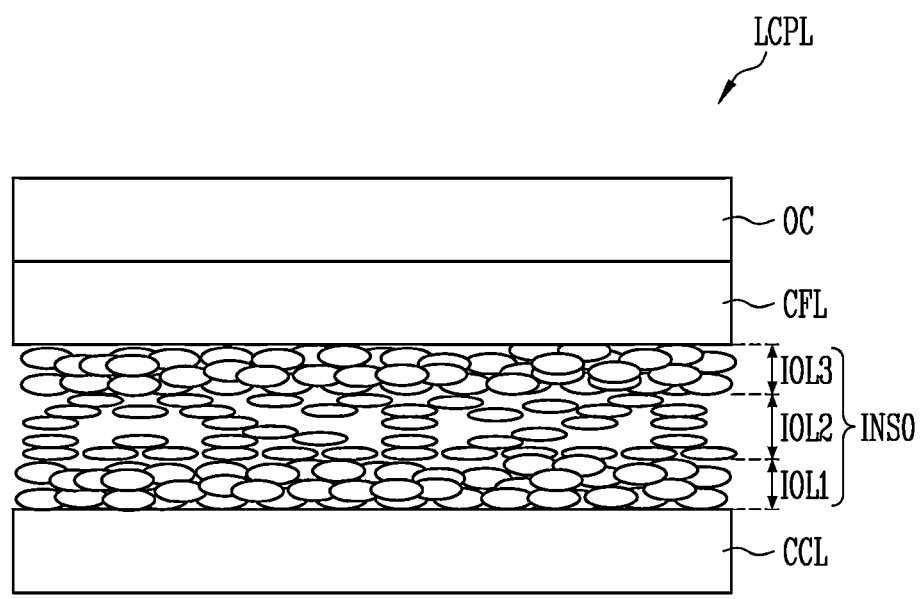
FIG. 5 is a schematic cross-sectional view illustrating an embodiment of a light conversion pattern layer included in the display device of FIGS. 3A to 3C.
Figure 6:
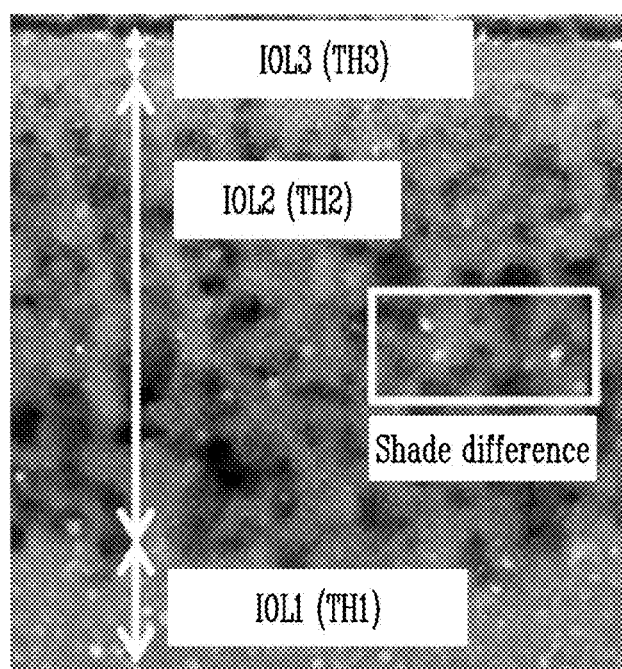
FIG. 6 is a schematic cross-sectional view illustrating an embodiment of an insulating layer included in the light conversion pattern layer of FIG. 5.

FIG. 5 is a schematic cross-sectional view illustrating an embodiment of the light conversion pattern layer included in the display device of FIGS. 3A to 3C. FIG. 6 is a schematic cross-sectional view illustrating an embodiment of the insulating layer included in the light conversion pattern layer of FIG. 5. FIG. 7 is a schematic diagram illustrating a density and a refractive index of the second inorganic layer included in the insulating layer of FIG. 6. FIG. 8 is a schematic diagram illustrating external quantum efficiency according to the refractive index of the second inorganic layer included in the insulating layer of FIG. 6. FIG. 9 is a schematic diagram illustrating external quantum efficiency according to a thickness of the second inorganic layer included in the insulating layer of FIG. 6.

Referring to FIGS. 3A to 3C, 5, and 6, the light conversion pattern layer LCPL may include the color conversion layer CCL, the insulating layer INS0 (or a refractive index conversion layer), the color filter layer CFL (or the color filter CF), and the overcoat layer OC. Since the color conversion layer CCL, the insulating layer INS0, the color filter layer CFL, and the overcoat layer OC are described with reference to FIG. 3A, a repetitive description is omitted.

In embodiments, some of the first inorganic layer IOL1, the second inorganic layer IOL2, and the third inorganic layer IOL3 may have different densities and/or different porosities. For example, the first, second, and third inorganic layers IOL1, IOL2, and IOL3 may include an inorganic material (or an inorganic particle) such as silicon nitride ($SiN_x$), silicon oxide ($SiO_x$), silicon oxynitride (SiON), or a combination thereof, and densities and/or porosities of the inorganic material may be different from each other in some of the first, second, and third inorganic layers IOL1, IOL2, and IOL3.

In an embodiment, a second density of the second inorganic layer IOL2 may be less than a first density of the first inorganic layer IOL1 and a third density of the third inorganic layer IOL3. In other words, the second porosity of the second inorganic layer IOL2 may be greater than the first porosity of the first inorganic layer IOL1 and the third porosity of the third inorganic layer IOL3.

As shown in FIG. 5, the density of the inorganic material in the second inorganic layer IOL2 may be relatively small, and thus, air (or pores) may exist between the inorganic materials in the second inorganic layer IOL2. For example, the porosity of the second inorganic layer IOL2 may be within a range of about 20% to about 80%. A pore may have an open shape (for example, an open pore) due to non-uniform arrangement of the inorganic material in the second inorganic layer IOL2. In other words, a size and/or a shape of a pore formed in the second inorganic layer IOL2 may be various.

The density of the inorganic material in each of the first inorganic layer IOL1 and the third inorganic layer IOL3 may be relatively high. A pore may hardly exist in the first inorganic layer IOL1 and the third inorganic layer IOL3, but the disclosure is not limited thereto. For example, the first porosity of the first inorganic layer IOL1 may be less than or equal to about 5%, and the third porosity of the third inorganic layer IOL3 may be less than or equal to about 20%.

For reference, the first inorganic layer IOL1 may have the largest density and/or the smallest porosity among the first, second, and third inorganic layers IOL1, IOL2, and IOL3 to prevent moisture (or a solution used in a subsequent process) from penetrating into the lower color conversion layer CCL. The second inorganic layer IOL2 may have the smallest density and/or the largest porosity among the first, second, and third inorganic layers IOL1, IOL2, and IOL3 regarding a refractive index (or total reflection according thereto). The third inorganic layer IOL3 may have a density greater than the second density of the second inorganic layer IOL2 and/or a porosity less than the second porosity of the second inorganic layer IOL2 to increase the contact area with the upper color filter layer CFL (coupling force, or stick force with the color filter layer CFL according to the contact area). Since the third inorganic layer IOL3 may have a function different from that of the first inorganic layer IOL1, the third inorganic layer IOL3 may have a density different from the first density (or less than the first density) of the first inorganic layer IOL1 or a porosity different from the first porosity of the first inorganic layer IOL1, but is not limited thereto. For example, the third density (or the third porosity) of the third inorganic layer IOL3 may be the same as the first density (or the first porosity) of the first inorganic layer IOL1.

Referring to FIG. 6, the insulating layer INS0 observed using a transmission electron microscope (TEM) is shown. In case that an electron is transmitted through the insulating layer INS0 using the TEM, an electron transmitting the insulating layer INS0 or emitted from the insulating layer INS0 is shaded. An area with no emitted electron or few emitted electron is shown darkly (or in a gray or a dark spot).

An electron may not be detected in the first inorganic layer IOL1 and the third inorganic layer IOL3, and thus the first inorganic layer IOL1 and the third inorganic layer IOL3 may be shown in gray. In the second inorganic layer IOL2, portions through which an electron transmits by a pore may exist, and thus a shade difference may be recognized in the second inorganic layer IOL2. For example, even in a case where the first, second, and third inorganic layers IOL1, IOL2, and IOL3 include the same inorganic material, the first, second, and third inorganic layers IOL1, IOL2, and IOL3 may be distinguished according to a density difference (or a porosity difference) of the first, second, and third inorganic layers IOL1, IOL2, and IOL3.

According to an embodiment, at least some of the first, second, and third inorganic layers IOL1, IOL2, and IOL3 may include different inorganic materials. The first, second, and third inorganic layers IOL1, IOL2, and IOL3 may be more readily distinguished based on the inorganic materials.

An image similar to that of FIG. 6 may be obtained through tomography using a focused ion beam (FIB) or the like. For example, the first, second, and third inorganic layers IOL1, IOL2, and IOL3 may be distinguished through the tomography using the FIB. The first, second, and third inorganic layers IOL1, IOL2, and IOL3 may also be distinguished through a porosity measurement method. For example, the porosity measurement method may analyze a specific surface area and a porosity of a corresponding inorganic layer by desorbing a specific gas. The porosity measurement method may use physical adsorption and chemisorption phenomena to measure an amount of gas adsorbed on a surface of the corresponding inorganic layer, and may measure the specific surface area regardless of a material of the inorganic layer. For example, a sample of the same standard may be obtained with respect to each of the first, second, and third inorganic layers IOL1, IOL2, and IOL3, nitrogen ($N_2$) may be adsorbed to the sample, and an amount of the adsorbed nitrogen gas may be measured, to measure a porosity.

The first, second, and third inorganic layers IOL1, IOL2, and IOL3 may also be distinguished through binding energy spectrum analysis. For example, in case that the first, second, and third inorganic layers IOL1, IOL2, and IOL3 include silicon oxide ($SiO_x$), coupling force between the silicon (Si) and oxygen (O) may appear relatively large in the first inorganic layer IOL1 and the third inorganic layer IOL3 according to the first density and the third density, and may appear relatively small in the second inorganic layer IOL2 according to the relatively small second density.

In an embodiment, at least some of the first, second, and third inorganic layers IOL1, IOL2, and IOL3 may have different refractive indices according to the first, second, and third densities. As the density of the inorganic material increases, the refractive index may increase, and as the density of the inorganic material decreases, the refractive index may decrease.

Referring to FIG. 7, in a first case, the density of the inorganic material in the inorganic layer may be relatively large, and a pore may hardly exist between the inorganic materials. The refractive index n of the inorganic layer of the first case may be about 1.45. The first density of the first inorganic layer IOL1 may be greater than the density of the first case, and thus the first refractive index (for example, about 1.6 or more) of the first inorganic layer IOL1 may be greater than a refractive index of the first case. Similarly, the third density of the third inorganic layer IOL3 may be greater than or equal to the density of the first case, and thus the third refractive index (for example, about 1.45 to about 1.8) of the third inorganic layer IOL3 may be greater than or equal to the refractive index of the first case.

Referring to a second case, a third case, and a fourth case, as the density of the inorganic material in the inorganic layer decreases, the pore between the inorganic materials may increase, and as the number of pores increases, the refractive index may decrease to be close to a refractive index of air (for example, about 1). For example, the refractive index of the second case may be about 1.3, the refractive index of the third case may be about 1.2, and the refractive index of the fourth case may be about 1.15. The second density of the second inorganic layer IOL2 may be similar to the densities of the second to fourth cases, and thus the second refractive index (for example, about 1.1 to about 1.3) of the second inorganic layer IOL2 may be similar to the refractive index according to the second to fourth cases.

In an embodiment, the second refractive index of the second inorganic layer IOL2 may be within a range of about 1.1 to about 1.3.

Referring to FIG. 8, in case that the first refractive index of the first inorganic layer IOL1 is a reference refractive index ref (for example, a refractive index of about 1.6), external quantum efficiency (EQE) (efficiency of light emitted to the outside from the pixel PXL, or light output efficiency) according to the second refractive index of the second inorganic layer IOL2 is shown. Here, the EQE may mean a ratio of the number of emitted photons to the total number of photons generated in the pixel PX. The second refractive index of the second inorganic layer IOL2 may be adjusted according to the density of the inorganic material in the second inorganic layer IOL2 as described with reference to FIG. 7.

In case that the second refractive index of the second inorganic layer IOL2 is about 1.6, since total reflection does not occur between the first inorganic layer IOL1 and the second inorganic layer IOL2, the EQE may be about 100%. In case that the second refractive index of the second inorganic layer IOL2 is about 1.3, the EQE may be about 110.2%, and as the second refractive index of the second inorganic layer IOL2 decreases, the EQE may increase. In case that the second refractive index of the second inorganic layer IOL2 is about 1.27, about 1.25, and about 1.23, the EQEs may be about 113.3%, about 115.0%, and about 116.6%. In case that the second refractive index of the second inorganic layer IOL2 is about 1.2, the EQE may be about 120.7%, which may exceed about 120%. In case that the second refractive index of the second inorganic layer IOL2 is 1.17 and 1.14, the EQEs may be about 121.8% and about 123.6%. In case that the second refractive index of the second inorganic layer IOL2 is about 1 that may be equal to the refractive index of air, the EQE may be a maximum value of about 125.9%. For example, in case that the second refractive index of the second inorganic layer IOL2 is about 1.3 or less, the EQE may be improved by about 10% or more. In case that the second refractive index of the second inorganic layer IOL2 is about 1.2 or less, the EQE may be improved by about 20% or more. In case that the second refractive index of the second inorganic layer IOL2 is about 1.14 or less, an increase of the EQE may not be large compared to the refractive index of about 1.14. In case that the second refractive index of the second inorganic layer IOL2 is about 1.1 or less, as the porosity of the second inorganic layer IOL2 increases, the contact area between the second inorganic layer IOL2 and the first and third inorganic layers IOL1 and IOL3 may decrease, and interfacial stick force may be decreased. Therefore, in consideration of the EQE (and the interfacial stick force), the second refractive index of the second inorganic layer IOL2 may be within a range of about 1.1 to about 1.3, or may be about 1.2.

The refractive indices of the first, second, and third inorganic layers IOL1, IOL2, and IOL3 may be measured using an optical measuring device such as an ellipsometer or a spectral reflectometer.

For example, as light passes through a medium (for example, an inorganic layer), the light may change in proportion to a refractive index and a thickness of the medium. The ellipsometer may calculate the thickness and a complex refractive index of the inorganic layer by measuring a polarization change amount of incident light and reflected light with respect to the inorganic layer. Here, the polarization change amount may mean an amplitude and a phase difference, and may depend on a parameter such as a wavelength, an incidence angle, the thickness of the inorganic layer, the complex refractive index, and the like (for example, $(d, n, k) = f(\psi, \Delta)$, here, d may be the thickness, $(n, k)$ may be the complex refractive index, $f(\psi, \Delta)$ may be the polarization change amount, $\psi$ may be the amplitude, and $\Delta$ may be the phase difference). In case that information on the incidence angle (fixed angle of incidence), the wavelength (single wavelength), and the thickness of the inorganic layer (for example, the thickness of the inorganic layer obtained through FIB tomography) is preset or obtained, the complex refractive index may be calculated from the polarization change amount. Even though information on the thickness of the inorganic layer does not exist, the refractive index of the inorganic layer may be measured by measuring the polarization change amount according to a change of the incidence angle (for example, a direction of the incident light).

For example, the spectral reflectometer may measure an intensity of the reflected light according to a wavelength in case that measurement light is perpendicular to a surface of the inorganic layer. The intensity of the reflected light may vary according to the thickness and the refractive index of the inorganic layer. For example, the spectral reflectometer may measure the refractive index of the inorganic layer by comparing the intensity of light obtained by changing the wavelength.

In an embodiment, a second thickness TH2 of the second inorganic layer IOL2 may be within a range of about 0.3 μm to about 0.6 μm.

Referring to FIG. 9, in case that the first refractive index of the first inorganic layer IOL1 is the reference refractive index ref (for example, a refractive index of about 1.6) and the second refractive index of the second inorganic layer IOL2 is about 1.23, the EQE (the efficiency of light emitted to the outside from the pixel PXL, or the light output efficiency) according to the second thickness TH2 of the second inorganic layer IOL2 is shown.

In case that the second thickness TH2 of the second inorganic layer IOL2 is within a range of about 0.7 μm to about 4.0 μm, the EQE may be within a range of about 120.0% to about 120.6%. For example, in case that the second thickness TH2 of the second inorganic layer IOL2 is about 0.7 μm or more, the second thickness TH2 of the second inorganic layer IOL2 may not affect the EQE.

In case that the second thickness TH2 of the second inorganic layer IOL2 is about 0.5 μm and about 0.3 μm, the EQE is about 119.8% and about 119.5%, and may be substantially within an error range based on about 120%.

However, as the second thickness TH2 of the second inorganic layer IOL2 may be less than about 0.3 μm, the EQE may decrease. In case that the second thickness TH2 of the second inorganic layer IOL2 is about 0.25 μm, about 0.2 μm, and about 0.1 μm, the EQEs may be about 117.2%, about 112.0%, and about 99.9%. For example, in case that the second thickness TH2 of the second inorganic layer IOL2 is less than about 0.3 μm, the EQE may be decreased by about 3% or more based on about 120%.

Therefore, in consideration of the EQE, the second thickness TH2 of the second inorganic layer IOL2 may be about 0.3 μm or more, and in consideration of thinning of the display panel DP (refer to FIG. 2), the second thickness TH2 of the second inorganic layer IOL2 may be about 0.6 μm or less.

Each of a first thickness TH1 of the first inorganic layer IOL1 and a third thickness TH3 of the third inorganic layer IOL3 may be about 0.1 μm (or about 1000 Å) or more. A function (for example, moisture penetration prevention) of the first inorganic layer IOL1 and a function (for example, adhesion force improvement) of the third inorganic layer IOL3 may be guaranteed.

As described above, the light conversion pattern layer LCPL may include the insulating layer INS0 disposed on the color conversion layer CCL, and the insulating layer INS0 may include the first inorganic layer IOL1, the second inorganic layer IOL2, and the third inorganic layer IOL3. The second density of the second inorganic layer IOL2 may be less than the first density of the first inorganic layer IOL1, and thus the second refractive index of the second inorganic layer IOL2 may be less than the first refractive index of the first inorganic layer IOL1. Therefore, total reflection may occur between the first inorganic layer IOL1 and the second inorganic layer IOL2, and the EQE (or the light efficiency) may be improved. The second refractive index of the second inorganic layer IOL2 may be within a range of about 1.1 to about 1.3, or may be about 1.2. The EQE (or the light efficiency) may be improved, and the interfacial stick force of the second inorganic layer IOL2 may be guaranteed. The second thickness TH2 of the second inorganic layer IOL2 may be within a range of about 0.3 µm to about 0.6 µm. The EQE (or the light efficiency) for a corresponding refractive index may be guaranteed, and the display device may be thinned.

Figure 10:
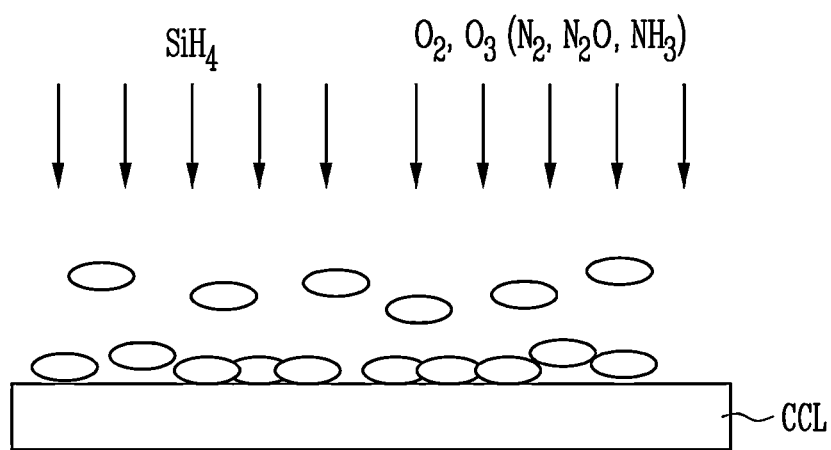
FIG. 10 is a schematic diagram illustrating a method of forming the insulating layer of FIG. 6.
Figure 11:
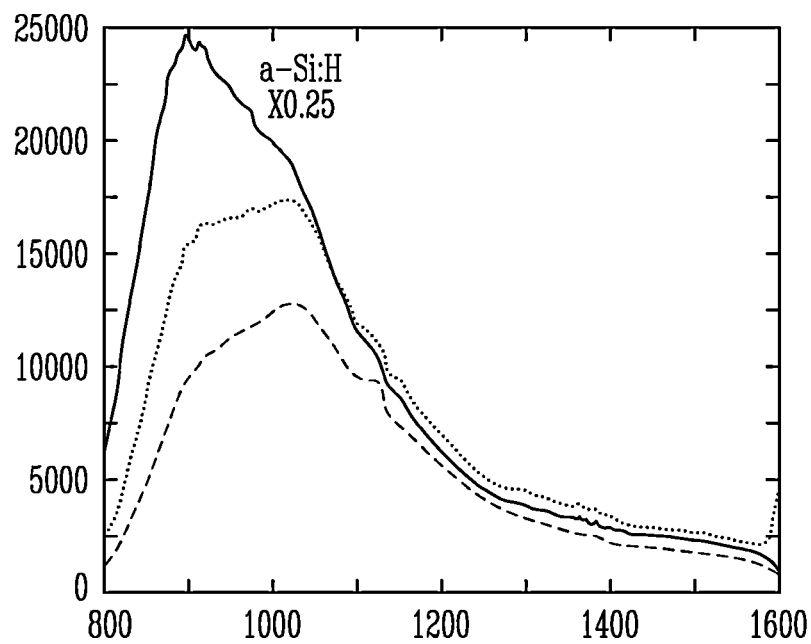
FIG. 11 is a schematic diagram illustrating a characteristic of the insulating layer of FIG. 6.

FIG. 10 is a schematic diagram illustrating a method of forming the insulating layer of FIG. 6. FIG. 11 is a schematic diagram illustrating a characteristic of the insulating layer of FIG. 6.

Referring to FIGS. 5, 6, 10, and 11, the insulating layer INS0 may be formed through a chemical vapor deposition (CVD) technique. The insulating layer INS0 may be formed by a reaction gas (or a source gas) reaching the color conversion layer CCL and causing a chemical reaction. The reaction gas may move around a surface of the color conversion layer CCL to cause the chemical reaction, and the insulating layer INS0 having a three-dimensional network structure may be formed according to a result of the chemical reaction.

In an embodiment, the insulating layer INS0 may be formed through a plasma enhanced chemical vapor deposition (PECVD) technique. In a case of the PECVD, energy required for a reaction gas to decompose (or dissociate) may be obtained from an electric field, and a temperature condition (for example, a temperature of the substrate) for deposition may be maintained to be relatively low below 400° C.

In an embodiment, as the reactive gases, silane ($SiH_4$) and oxygen ($O_2$) (and/or ozone ($O_3$)) may be used. The insulating layer INS0 may include silicon oxide ($SiO_x$). At least one of the first inorganic layer IOL1, the second inorganic layer IOL2, and the third inorganic layer IOL3 may include silicon oxide ($SiO_x$).

In another embodiment, as the reactive gas, nitrogen (N2), nitrous oxide ($N_2O$), ammonia ($NH_3$), or the like may be used in addition to silane ($SiH_4$). The insulating layer INS0 may include silicon nitride ($SiN_x$) and/or silicon oxynitride (SiON). At least one of the first inorganic layer IOL1, the second inorganic layer IOL2, and the third inorganic layer IOL3 may include silicon nitride ($SiN_x$) and/or silicon oxynitride (SiON).

The insulating layer INS0 formed through CVD may have a non-uniform structure due to a characteristic of the CVD. Using such a non-uniform structure, the second inorganic layer IOL2 (for example, the second inorganic layer IOL2 including the pore) of the insulating layer INS0 may be more readily formed.

The insulating layer INS0 formed through the CVD may include an impurity due to the characteristic of the CVD. For reference, amorphous silicon (a-Si) may be formed from silane ($SiH_4$) at 550° C. or less, and hydrogenated amorphous silicon (a-Si:H) may be formed by combination of amorphous silicon (a-Si) and hydrogen (for example, hydrogen decomposed from silane ($SiH_4$)) at about 400° C. or less. For example, the insulating layer INS0 may include hydrogen within a range of about 10% to about 35%. For example, According to an embodiment, the insulating layer INS0 (for example, the second inorganic layer IOL2) formed through the CVD may further include an impurity such as hydrogenated amorphous silicon (a-Si:H).

Referring to FIG. 11, a photoluminescence (PL) spectrum of the insulating layer INS0 is shown.

Since the insulating layer INS0 (for example, the second inorganic layer IOL2) may be formed through the CVD, the insulating layer INS0 (for example, the second inorganic layer IOL2) may further include an impurity such as hydrogenated amorphous silicon (a-Si:H), and thus in the PL spectrum of the insulating layer INS0 (for example, the second inorganic layer IOL2), a peak value may appear in a range between 900 nm and 1000 nm by the hydrogenated amorphous silicon (a-Si:H).

For reference, in a case of physical vapor deposition (PVD) such as sputtering, a chemical composition of a raw material (for example, silicon (Si) and oxygen (O2)) may not be changed and may be deposited as a thin layer. For example, the inorganic layer formed through sputtering may include only silicon oxide (SiOx) and may hardly include another impurity such as hydrogenated amorphous silicon (a-Si:H). Accordingly, the PL spectrum of the inorganic layer formed through sputtering may appear differently from the PL spectrum of the insulating layer INS0 (for example, the second inorganic layer IOL2). For example, the insulating layer INS0 (for example, the second inorganic layer IOL2) formed through the CVD may be distinguished from the inorganic layer formed through the PVD such as sputtering.

The inorganic layer formed through sputtering may have a uniform structure due to a characteristic of a sputtering technology, and may not include a pore described with reference to FIG. 5. Since the inorganic material in the inorganic layer formed through sputtering may be physically combined, adhesion force (stick force) may be less than that of the insulating layer INS0 (or the second inorganic layer IOL2) formed through the CVD.

In embodiments, the first inorganic layer IOL1, the second inorganic layer IOL2, and the third inorganic layer IOL3 may be formed through the CVD, and a deposition condition (or a deposition speed) of the second inorganic layer IOL2 may be different from the deposition condition of the first inorganic layer IOL1.

For reference, the density of the inorganic layer may vary according to a deposition condition (or a process factor) such as a flow rate of the reaction gas (for example, a time when the reaction gas stays in a chamber in which the CVD may be performed), a temperature of the substrate, and power (for example, power for plasma discharge in the PECVD). For example, as the power increases, a growth speed (or the deposition speed) of the inorganic layer may increase or the density may increase. For example, the first inorganic layer IOL1 may be formed under a deposition condition using relatively high power, and the second inorganic layer IOL2 may be formed under a deposition condition using relatively low power.

For example, the first inorganic layer IOL1, the second inorganic layer IOL2, and the third inorganic layer IOL3 may be formed through the same CVD, and the mutually distinguished first, second, and third inorganic layers IOL1, IOL2, and IOL3 may be successively formed by differentiating the deposition condition such as the flow rate, the temperature, and the power. Since only one deposition technique may be used for the first inorganic layer IOL1, the second inorganic layer IOL2, and the third inorganic layer IOL3, a manufacturing process may be simplified compared to a case where the insulating layer INS0 may be formed using other deposition techniques (for example, the CVD method, the sputtering method, or the inkjet method).

The method of manufacturing the display device according to embodiments of the disclosure may include a method of forming the insulating layer of FIG. 10.

Referring to FIGS. 3A and 10, the method of manufacturing the display device may include forming the color conversion layer CCL on the substrate SUB, forming the insulating layer INS0 on the color conversion layer CCL through the CVD, and forming the color filter layer CFL (or the color filter) on the insulating layer INS0. Before forming the color conversion layer CCL, the method of manufacturing the display device may include forming the pixel circuit layer PCL including the transistor T on the substrate SUB, and forming the display element layer DPL including the light emitting element LD on the pixel circuit layer PCL (refer to FIG. 4). The color conversion layer CCL may be formed on the display element layer DPL.

In embodiments, in forming the insulating layer INS0, the method of manufacturing the display device may include forming the first inorganic layer IOL1 on the color conversion layer CCL under a first deposition condition, forming the second inorganic layer IOL2 on the first inorganic layer IOL1 under a second deposition condition, and forming the third inorganic layer IOL3 on the second inorganic layer IOL2 under a third deposition condition. The second deposition condition (or a second deposition speed) may be different from the first deposition condition (or a first deposition speed) and a third deposition condition (or a third deposition speed). According to the second deposition condition, the second density (or the second refractive index) of the second inorganic layer IOL2 may be less than the first density (or the first refractive index) of the first inorganic layer IOL1 and the third density (or the third refractive index) of the third inorganic layer IOL3.

As described above, the first inorganic layer IOL1, the second inorganic layer IOL2, and the third inorganic layer IOL3 may be formed through the same CVD. The second inorganic layer IOL2 having a relatively low density may be formed by using a non-uniform structure that occurs due to the characteristic of the CVD and by controlling the deposition condition (or the deposition speed).

Figure 12:
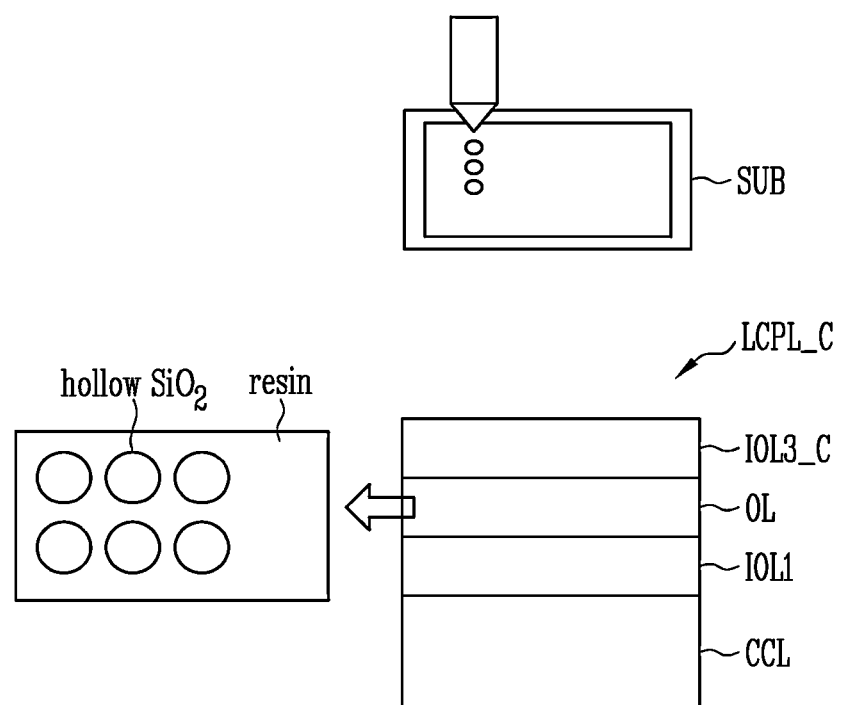
FIG. 12 is a schematic diagram illustrating a light conversion pattern layer and a method of manufacturing the same according to a comparative example.

FIG. 12 is a schematic diagram illustrating a light conversion pattern layer and a method of manufacturing the same according to a comparative example.

Referring to FIG. 12, the light conversion pattern layer LCPL_C may include a color conversion layer CCL, a first inorganic layer IOL1, an organic layer OL, and a third inorganic layer IOL3_C.

The color conversion layer CCL, the first inorganic layer IOL1, and the third inorganic layer IOL3_C may be substantially the same as or similar to the color conversion layer CCL, the first inorganic layer IOL1, and the third inorganic layer IOL3 described with reference to FIGS. 3A and 5, a repetitive description is omitted.

The organic layer OL may be disposed between the first inorganic layer IOL1 and the third inorganic layer IOL3_C.

The organic layer OL may have a relatively low refractive index. For example, the organic layer OL may include an organic material such as a resin and an inorganic filler dispersed in the organic material. The inorganic filler may include a hollow, and the organic layer OL may have a relatively low refractive index due to the inorganic filler. For example, the inorganic filler may be hollow $SiO_2$. The hollow silica may include a hollow formed between silica particles, and the hollow may have a closed shape (for example, a closed pore) by the silica particles. For example, a size of the hollow (or the hollow of the hollow silica) in the organic layer OL may have a uniform size and/or shape. The inorganic filler (or the hollow silica) having the uniform hollow may be relatively expensive. For example, in case that the organic layer OL is manufactured using the inorganic filler, a manufacturing cost may increase.

The organic layer OL including the inorganic filler dispersed in the resin may be formed through an inkjet method (or a slit coding method). For example, the organic layer OL may be formed by discharging the resin in which the inorganic filler may be dispersed onto the substrate SUB (or the color conversion layer) using an inkjet printer. The first inorganic layer IOL1 and the third inorganic layer IOL3_C may be formed through CVD (or PVD), and in order to form the organic layer OL between the first inorganic layer IOL1 and the third inorganic layer IOL3_C, an inkjet method (or a slit coding method) different from the CVD (or the PVD) may be required.

In case that the organic layer OL is formed by the inkjet method, clogging may occur in a nozzle of the inkjet printer according to a type of the resin, and thus a thickness of the organic layer OL may not be uniformly formed. Staining may occur due to non-uniform thickness of the organic layer OL.

In case that a ratio of the inorganic filler increases (for example, in case that the ratio of the inorganic filler in the organic layer OL is about 50% or more) to decrease a refractive index of the organic layer OL, adhesive force of the organic layer OL may decrease, and a defect such as peeling of the organic layer OL may occur.

On the other hand, in the method of manufacturing the display device according to embodiments of the disclosure, the second inorganic layer IOL2 (refer to FIG. 5) may be formed through the CVD and control of the deposition condition (or the deposition speed). Therefore, a manufacturing cost (and an equipment cost) may be reduced, and the manufacturing process may be simplified. Since the first, second, and third inorganic layers IOL1, IOL2, and IOL3 according to embodiments of the disclosure may include the same material (and may be mutually coupled through a chemical reaction), a defect such as peeling may not occur.

The third inorganic layer IOL3_C may be disposed on the organic layer OL, and may prevent moisture from penetrating into the organic layer OL. For example, the third inorganic layer IOL3_C may perform the same function as the first inorganic layer IOL1. Accordingly, the third inorganic layer IOL3_C may have the same density and/or refractive index as that of the first inorganic layer IOL1.

Although the disclosure has been described with reference to embodiments above, those of ordinary skill in the art will understand that embodiments may be variously modified and changed without departing from the spirit of the disclosure.

Therefore, the technical scope of the disclosure should not be limited to the contents described in the detailed description but rather should be interpreted to include modifications thereof.

What is claimed is:
1. A display device comprising:
   a light emitting element disposed on a substrate;
   a color conversion layer disposed on the light emitting element, the color conversion layer including color conversion particles that convert light of a first color emitted from the light emitting element into light of a second color; and
   an insulating layer disposed on the color conversion layer, the insulating layer including:

a first inorganic layer overlapping the color conversion layer;

a second inorganic layer disposed on the first inorganic layer; and a third inorganic layer disposed on the second inorganic layer, wherein a second porosity of the second inorganic layer is greater than a first porosity of the first inorganic layer, and the second porosity of the second inorganic layer is greater than a third porosity of the third inorganic layer.

2. The display device according to claim 1, wherein the second porosity of the second inorganic layer is within a range of about 20% to about 80%.

3. The display device according to claim 1, wherein the first porosity of the first inorganic layer is less than a third porosity of the third inorganic layer.

4. The display device according to claim 1, wherein the first porosity of the first inorganic layer is less than or equal to about 5%, and the third porosity of the third inorganic layer is less than or equal to about 20%.

5. The display device according to claim 1, wherein a second refractive index of the second inorganic layer is less than a first refractive index of the first inorganic layer.

6. The display device according to claim 5, wherein the second refractive index of the second inorganic layer is within a range of about 1.1 to about 1.3.

7. The display device according to claim 6, wherein the second refractive index of the second inorganic layer is about 1.2.

8. The display device according to claim 1, wherein a thickness of the second inorganic layer is within a range of about 0.3 μm to about 0.6 μm.

9. The display device according to claim 8, wherein a thickness of the first inorganic layer is greater than or equal to about 0.1 μm, and a thickness of the third inorganic layer is greater than or equal to about 0.1 μm.

10. The display device according to claim 1, wherein the first inorganic layer, the second inorganic layer, and the third inorganic layer include a same material.

11. The display device according to claim 1, wherein at least part of the first inorganic layer, the second inorganic layer, and the third inorganic layer include different materials.

12. The display device according to claim 1, wherein the second inorganic layer includes hydrogenated amorphous silicon (a-Si:H).

13. The display device according to claim 11, wherein the second inorganic layer further includes at least one of silicon oxide ($SiO_x$), silicon nitride ($SiN_x$), and silicon oxynitride (SiON).

14. The display device according to claim 13, wherein the insulating layer does not include hollow silica and an organic material.

15. The display device according to claim 1, wherein the first inorganic layer, the second inorganic layer, and the third inorganic layer are formed through chemical vapor deposition, and a deposition condition of the second inorganic layer is different from a deposition condition of the first inorganic layer.

16. The display device according to claim 1, further comprising:

a color filter disposed on the insulating layer; and an overcoat layer disposed on the color filter.

17. The display device according to claim 1, wherein the light emitting element includes an inorganic light emitting diode.

18. A method of manufacturing a display device, the method comprising:

forming a color conversion layer on a display element layer that includes a light emitting element; and forming an insulating layer on the color conversion layer through chemical vapor deposition, wherein the forming of the insulating layer includes:

forming a first inorganic layer on the color conversion layer under a first deposition condition;

forming a second inorganic layer on the first inorganic layer under a second deposition condition; and forming a third inorganic layer on the second inorganic layer, wherein the first deposition condition is different from the second deposition condition, and a second porosity of the second inorganic layer is greater than a first porosity of the first inorganic layer.

19. The method according to claim 18, wherein the first porosity of the first inorganic layer is less than a third porosity of the third inorganic layer.

20. The method according to claim 18, wherein a second refractive index of the second inorganic layer is less than a first refractive index of the first inorganic layer.

* * * * *